(12) United States Patent
Tanaka et al.

(10) Patent No.: US 8,455,790 B2
(45) Date of Patent: Jun. 4, 2013

(54) LASER IRRADIATION APPARATUS, LASER IRRADIATION METHOD, AND MANUFACTURING METHOD OF SEMICONDUCTOR DEVICE

(75) Inventors: Koichiro Tanaka, Isehara (JP); Hirotada Oishi, Atsugi (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 1642 days.

(21) Appl. No.: 11/636,596

(22) Filed: Dec. 11, 2006

(65) Prior Publication Data

US 2007/0138151 A1 Jun. 21, 2007

(30) Foreign Application Priority Data

Dec. 16, 2005 (JP) ................. 2005-362766

(51) Int. Cl.
*H01L 21/428* (2006.01)
*H01L 21/426* (2006.01)

(52) U.S. Cl.
USPC .............. 219/121.65; 219/121.73; 219/121.8; 438/487

(58) Field of Classification Search
USPC 219/121.63–121.75, 121.78, 121.8; 438/463, 438/166, 487, 795; 430/5
See application file for complete search history.

(56) References Cited

U.S. PATENT DOCUMENTS

| | | | |
|---|---|---|---|
| 5,835,249 A | 11/1998 | Yamada et al. | |
| 5,896,233 A | 4/1999 | Soda et al. | |
| 6,172,330 B1 | 1/2001 | Yamamoto et al. | |
| 6,245,585 B1 * | 6/2001 | Fujimoto | 438/14 |
| 6,353,203 B1 | 3/2002 | Hokodate et al. | |
| 6,416,908 B1 * | 7/2002 | Klosner et al. | 430/5 |

(Continued)

FOREIGN PATENT DOCUMENTS

| | | |
|---|---|---|
| EP | 1326273 A | 7/2003 |
| JP | 01-276621 | 11/1989 |

(Continued)

OTHER PUBLICATIONS

International Search Report (Application No. PCT/JP2006/324396) Dated Feb. 27, 2007.

(Continued)

*Primary Examiner* — Samuel M Heinrich
(74) *Attorney, Agent, or Firm* — Eric J. Robinson; Robinson Intellectual Property Law Office, P.C.

(57) ABSTRACT

To provide a laser irradiation apparatus and a laser irradiation method in which a region formed with microcrystals in a region irradiated with laser beams is decreased by disposing a slit in an optical system using a deflector, and laser processing can be favorably conducted to a semiconductor film. Further to provide a semiconductor manufacturing apparatus using the above-described laser irradiation apparatus and the laser irradiation method. In the optical system, an f-θ lens having an image space telecentric characteristic or a slit the shape of which is changed in accordance with the incidence angle of a laser beam, is used. The slit is disposed between the f-θ lens and an irradiation surface, and an image at a slit opening portion is projected onto the irradiation surface by a projection lens. By the above-described structure, laser irradiation can be uniformly conducted to a whole region scanned with laser beams.

15 Claims, 18 Drawing Sheets

U.S. PATENT DOCUMENTS

| | | |
|---|---|---|
| 6,506,635 B1 | 1/2003 | Yamazaki et al. |
| 6,660,609 B2 | 12/2003 | Tanaka et al. |
| 6,700,096 B2 | 3/2004 | Yamazaki et al. |
| 6,770,546 B2 | 8/2004 | Yamazaki |
| 6,821,343 B2 | 11/2004 | Hara et al. |
| 6,849,825 B2 | 2/2005 | Tanaka |
| 6,897,889 B2 | 5/2005 | Tanaka |
| 7,115,903 B2 | 10/2006 | Isobe et al. |
| 7,652,286 B2 | 1/2010 | Isobe et al. |
| 2003/0112322 A1 | 6/2003 | Tanaka |
| 2003/0148565 A1 | 8/2003 | Yamanaka |
| 2004/0065643 A1 | 4/2004 | Tanaka |
| 2004/0074881 A1 | 4/2004 | Oishi |
| 2004/0082090 A1 | 4/2004 | Hatano et al. |
| 2004/0209410 A1 | 10/2004 | Tanaka |
| 2004/0252730 A1* | 12/2004 | McCaughan et al. ............ 372/6 |
| 2005/0036190 A1 | 2/2005 | Tanaka |
| 2005/0037552 A1 | 2/2005 | Yamazaki et al. |
| 2005/0139582 A1 | 6/2005 | Tanaka |
| 2005/0181550 A1 | 8/2005 | Tanaka |
| 2005/0245007 A1 | 11/2005 | Azami et al. |
| 2005/0247684 A1 | 11/2005 | Tanaka |

FOREIGN PATENT DOCUMENTS

| | | |
|---|---|---|
| JP | 07-060462 A | 3/1995 |
| JP | 09-270393 | 10/1997 |
| JP | 10-032166 | 2/1998 |
| JP | 11-342485 | 12/1999 |
| JP | 2003-045820 | 2/2003 |
| JP | 2003-086507 | 3/2003 |
| JP | 2003-229376 | 8/2003 |
| JP | 2003-257865 A | 9/2003 |
| JP | 2004-146823 | 5/2004 |
| JP | 2004-343093 | 12/2004 |
| JP | 2005-217267 A | 8/2005 |
| JP | 2005-347741 A | 12/2005 |

OTHER PUBLICATIONS

Written Opinion (Application No. PCT/JP2006/324396) Dated Feb. 27, 2007.

Korean Office Action (Application No. 2008-7017315) Dated Mar. 8, 2013.

* cited by examiner irradiation surface width of opening portion

000## LASER IRRADIATION APPARATUS, LASER IRRADIATION METHOD, AND MANUFACTURING METHOD OF SEMICONDUCTOR DEVICE

TECHNICAL FIELD

The present invention relates to a laser irradiation apparatus (an apparatus including a laser oscillator and an optical system for introducing a laser beam output from the laser oscillator to an irradiation object) and a laser irradiation method for uniformly and efficiently conducting laser irradiation which is for a semiconductor material or the like. Further, the present invention relates to a manufacturing method of a semiconductor device including the above-described laser irradiation step.

BACKGROUND ART

In the manufacture of a semiconductor device, a laser irradiation method is often used. One reason for this is that the processing time can be more drastically reduced in the laser irradiation method than in a solid phase crystallization method utilizing radiation heating or conductive heating. Another reason is that a substrate which is easily deformed by heat, such as a glass substrate does not suffer thermal damages in the laser irradiation method.

For conducting laser irradiation, an irradiation object needs to be scanned with a laser beam which has been emitted from a laser oscillator. As a scanning method of a laser beam, there is an optical system using a galvanometer mirror and an f-θ lens. Since the galvanometer mirror has a variable angle of inclination, an arbitrary position on an irradiation object can be irradiated with a laser beam which has been reflected by the galvanometer mirror. This enables laser irradiation over an entire surface of the irradiation object by conducting scan in an X direction with a galvanometer mirror and conducting transition in a Y direction with a robot provided over a stage. Further, when two galvanometer mirrors are disposed, one of them conducts scan in an X direction, and the other conducts scan in a Y direction, an arbitrary position on an irradiation object can be irradiated with a laser beam (for example, Reference 1: Japanese Published Patent Application No. 2003-86507).

DISCLOSURE OF INVENTION

By scanning an irradiation surface with a beam spot by using the above-described laser irradiation apparatus, laser irradiation which is for a semiconductor material or the like can be conducted. As an example of this step, a method will be described, in which laser irradiation is conducted by forming a CW (continuous-wave) laser beam which is second harmonic having a wavelength of 532 nm and a power of 10 W into a linear beam spot having a length of approximately 300 μm in a major-axis direction and a length of approximately 10 μm in a minor-axis direction and by scanning with this beam spot in a minor-axis direction. Here, it is to be noted that the linear beam spot means a rectangular or elliptical beam spot having a high aspect ratio. In addition, the reason why scan of the beam spot in a minor-axis direction is conducted is that the method is the most efficient scanning method. In a portion scanned with the beam spot, a region where a crystal grain in a semiconductor film becomes larger is formed. When the size of a crystal grain becomes larger, the number of grain boundaries in a channel region of a TFT formed using this semiconductor film decreases and the mobility becomes higher so that a more sophisticated device can be developed (hereinafter, in this specification, a crystal having such a large grain size is referred to as a large grain crystal). At this time, the width of a region including a large grain crystal obtained by one-time scan is approximately 200 μm. Therefore, in order to crystallize the entire surface of the semiconductor film by laser irradiation, it is necessary to carry out laser irradiation in such a way that a position scanned with a laser beam is shifted in a major-axis direction of a beam spot by a width of a large grain crystal region obtained by one-time scan of the beam spot.

FIG. 16 shows an irradiation track of a beam spot 1001 used for laser irradiation in a semiconductor film, and an energy density distribution 1002 in a cross section A-A' of the beam spot 1001. In general, the cross section of a laser beam emitted from a laser oscillator with $TEM_{00}$ mode (single transverse mode) has a Gaussian energy distribution as shown by a reference numeral 1002 in FIG. 16, and does not have a homogeneous energy distribution.

The energy density of a central portion of the beam spot is set higher than a threshold (Y) at which a large grain crystal can be obtained. At this time, the energy density of an edge of the beam spot is higher than a threshold (X) at which a crystalline region is formed and is lower than the threshold (Y). Therefore, when the semiconductor film is irradiated with such a laser beam, some parts which are not melted completely remain in a region 1004 which is irradiated with the edge of the beam spot. In the region 1004, not the large grain crystal which is formed in a region 1003 irradiated with the central portion of the beam spot but only a crystal grain having a relatively small grain size (hereinafter referred to as a microcrystal) is formed.

A semiconductor element formed in the region where the microcrystal is formed in this way, that is, the region 1004 irradiated with the edge of the beam spot cannot achieve a high characteristic. In order to avoid this, it is necessary to form a semiconductor element in the region where the large grain crystal is formed, that is, the region 1003 irradiated with the central portion of the beam spot. In such a case, it is apparent that the layout is restricted. Accordingly, it is required to decrease the proportion of the region where the microcrystal is formed in the whole region irradiated with the laser beams.

In order to eliminate the microcrystalline region, a method can be considered, in which a slit is disposed in a light path of a laser beam and both edges of a linear beam spot, which have low energy, are eliminated. In other words, a beam having an energy density distribution with a shape of FIG. 17A right after the emission of the laser beam is changed into a beam having an energy density distribution shown by a solid line in FIG. 17B by passing through the slit.

Here, FIG. 18A shows an example in which slits 1103 are disposed in a light path of an optical system which uses a galvanometer mirror 1101 that is a deflector and an f-θ lens 1102. In the optical system of FIG. 18A, the slits 1103 are disposed before the galvanometer mirror 1101. The slits 1103 are usually disposed in a light path 1005 of a laser beam so as to intercept beam edges. FIG. 18B shows a positional relation between a cross section 1105 of the laser beam and the slits 1103. The laser beam having passed through a slit opening portion is deflected by the galvanometer mirror and enters the optical system. Then, by changing the angle of inclination of the galvanometer mirror, an irradiation surface can be scanned with the laser beam. Here, the light path 1005 shown in the drawing is a light path of the laser beam which enters the f-θ lens from a perpendicular direction. On the other hand, a light path 1006 is a light path which enters the f-θ lens from an oblique direction. Comparing these light paths, the light path 1006 has a longer light path length than the light path 1005 since the light path 1006 enters the irradiation surface with an angle therebetween. That is, the light path length of a laser beam varies depending on the angle of inclination of the galvanometer mirror.

In the case of providing slits in an optical system, in order to avoid a diffraction effect of a laser beam by the slits, it is necessary to be a conjugate relation between a slit opening portion and an irradiation surface by providing a projection lens. A laser beam having passed through the slit opening portion is projected onto the irradiation surface. In that case, in the optical system of FIG. 18A, the light path length of a laser beam varies depending on the angle of inclination of the galvanometer mirror as described above; accordingly, it is impossible to unambiguously determine the distance between the slits, the projection lens and the irradiation surface. Therefore, it is difficult to be the conjugate relation between the slits and the irradiation surface in a whole range of the irradiation region. In addition, in the case of disposing the slits in the vicinity of a substrate, it is also difficult to completely eliminate the diffraction effect by the slits. Therefore, in the case where a semiconductor film is processed by an optical system which uses a galvanometer mirror and an f-θ lens, it is difficult to eliminate a region where a microcrystal is formed.

In such a situation, it is an object of the present invention to solve the above-described problem and provide a laser irradiation apparatus and a laser irradiation method in which laser irradiation can be favorably conducted to a semiconductor film by decreasing the proportion of a region where microcrystals are formed, in a whole region irradiated with laser beams, when conducting laser beam irradiation with an optical system which uses a deflector such as a galvanometer mirror and an f-θ lens. Further, it is another object of the present invention to provide a semiconductor manufacturing apparatus using the above-described laser irradiation apparatus or laser irradiation method.

One feature of the structure of a laser irradiation apparatus of the present invention is to include a laser oscillator, a deflector which deflects a laser beam emitted from the laser oscillator at a deflection surface and scans an irradiation surface with the laser beam by changing the angle of inclination of this deflection surface, an imaging optical system which condenses the laser beam deflected by the deflector to the irradiation surface, a slit which is provided between the imaging optical system and the irradiation surface and intercepts an edge of the laser beam, and a projection lens which projects an image formed at the slit in a path which the laser beam passes onto the irradiation surface.

One feature of the structure of a laser irradiation apparatus of the present invention is to include a laser oscillator, a deflector which deflects a laser beam emitted from the laser oscillator at a deflection surface and scans an irradiation surface with the laser beam by changing the angle of inclination of the deflection surface, an optical system which processes the laser beam so as to form a linear beam spot on the irradiation surface, an imaging optical system which condenses the laser beam deflected by the deflector to the irradiation surface, a slit which is provided between the imaging optical system and the irradiation surface and intercepts an edge of the laser beam, and a projection lens which projects an image formed at the slit in a path which the laser beam passes onto the irradiation surface.

In the present invention, a continuous-wave laser oscillator or a pulsed laser oscillator can be used as the laser oscillator. One feature of the structure of the above-described laser irradiation apparatus is that the continuous-wave laser oscillator is one or a plurality of an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a helium-cadmium laser, a GaN laser, a GaAs laser, and an InAs laser.

One feature of the structure of the above-described laser irradiation apparatus is that the pulsed laser oscillator is one or a plurality of an Ar laser, a Kr laser, an excimer laser, a $CO_2$ laser, a YAG laser, a $YVO_4$ laser, a YLF laser, a $YAlO_3$ laser, a $GdVO_4$ laser, a $Y_2O_3$ laser, a glass laser, a ruby laser, an alexandrite laser, a Ti:sapphire laser, a GaN laser, a GaAs laser, an InAs laser, a copper vapor laser, and a gold vapor laser.

In the structure of the above-described laser irradiation apparatus, the laser beam is desirably converted into a higher harmonic wave by a nonlinear optical device. For example, a YAG laser is known as a laser which emits a laser beam with a wavelength of 1064 nm as a fundamental wave. This laser beam has an extremely low absorption coefficient to a silicon film, and with this state, it is technically difficult to perform crystallization of an amorphous silicon film which is one kind of semiconductor films by laser irradiation. However, by using the nonlinear optical device, this laser beam can be converted into a short wavelength laser, and there are second harmonic (532 nm), third harmonic (355 nm), fourth harmonic (266 nm), and fifth harmonic (213 nm) as the higher harmonic wave. Since these higher harmonic waves have high absorption coefficients to an amorphous silicon film, they can be used to crystallize the amorphous silicon film. A laser medium of a laser oscillator having a higher harmonic wave is generally doped with Nd, Yb, Cr, or the like, and by the excitation of these elements, laser oscillation occurs.

One feature of the structure of the above-described laser irradiation apparatus is that the deflector is one or a plurality of a galvanometer mirror, a polygon mirror, an acousto-optic deflector (AOD), an electro optical deflector (EOD), a resonant scanner, a hologram scanner and a conical scanner.

In the structure of the above-described laser irradiation apparatus, the imaging optical system is an f-θ lens or a telecentric f-θ lens. The telecentric f-θ lens is an f-θ lens having an image space telecentric characteristic. When the telecentric f-θ lens is used, the incidence angle of a laser beam from the telecentric f-θ lens to the irradiation surface can be fixed.

One feature of the structure of the above-described laser irradiation apparatus is that the projection lens is a convex cylindrical lens.

One feature of the structure of a laser irradiation method of the present invention is to include the steps of deflecting a laser beam emitted from a laser oscillator by a deflector which includes a deflection surface and can change the angle of inclination of the deflection surface, passing the deflected laser beam through an imaging optical system, intercepting an edge of the laser beam by a slit disposed between the imaging optical system and an irradiation surface, projecting an image formed at the slit in a path which the laser beam passes onto the irradiation surface by a projection lens, and scanning the irradiation surface with the formed beam spot.

One feature of the structure of a laser irradiation method of the present invention is to include the steps of processing a laser beam emitted from a laser oscillator by an optical system so as to form a linear beam spot on an irradiation surface, deflecting the laser beam by a deflector which includes a deflection surface and can change the angle of inclination of the deflection surface, passing the deflected laser beam through an imaging optical system, intercepting an edge of the laser beam by a slit disposed between the imaging optical system and the irradiation surface, projecting an image formed at the slit in a path which the laser beam passes onto the irradiation surface by a projection lens, and scanning the irradiation surface with the formed beam spot.

In the present invention, a continuous-wave laser oscillator or a pulsed laser oscillator can be used as the laser oscillator. One feature of the structure of the above-described laser irradiation method is that the continuous-wave laser oscillator is one or a plurality of an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a helium-cadmium laser, a GaN laser, a GaAs laser, and an InAs laser.

One feature of the structure of the above-described laser irradiation method is that the pulsed laser oscillator is one or a plurality of an Ar laser, a Kr laser, an excimer laser, a $CO_2$ laser, a YAG laser, a $YVO_4$ laser, a YLF laser, a $YAlO_3$ laser, a $GdVO_4$ laser, a $Y_2O_3$ laser, a glass laser, a ruby laser, an alexandrite laser, a Ti:sapphire laser, a GaN laser, a GaAs laser, an InAs laser, a copper vapor laser, and a gold vapor laser.

In the structure of the above-described laser irradiation method, the laser beam is desirably converted into a higher harmonic wave by a nonlinear optical device. A laser medium of a laser oscillator having a higher harmonic wave is generally doped with Nd, Yb, Cr, or the like, and by the excitation of these elements, laser oscillation occurs.

One feature of the structure of the above-described laser irradiation method is that the deflector is one or a plurality of a galvanometer mirror, a polygon mirror, an acousto-optic deflector (AOD), an electro optical deflector (EOD), a resonant scanner, a hologram scanner and a conical scanner.

One feature of the structure of the above-described laser irradiation method is that the imaging optical system is an f-θ lens or a telecentric f-θ lens.

One feature of the structure of the above-described laser irradiation method is that the projection lens is a convex cylindrical lens.

One feature of the structure of a manufacturing method of a semiconductor device of the present invention is to include the steps of forming a semiconductor film over a substrate, forming a beam spot over the semiconductor film by the laser irradiation method of the present invention, and scanning the semiconductor film with the beam spot to conduct laser irradiation to the entire semiconductor film.

A laser irradiation method in this specification indicates a technique for crystallizing a damaged region or an amorphous region which is formed in a semiconductor substrate or a semiconductor film by ion implantation or the like, a technique for crystallizing a semiconductor film by irradiating an amorphous semiconductor film formed over a substrate with a laser beam, a technique in which an element for promoting crystallization such as nickel is added in a crystalline (not single-crystalline) semiconductor film and laser irradiation is conducted to perform crystallization, or the like. In addition, the laser irradiation method in this specification also includes a technique which is applied for planarization or surface modification of a semiconductor substrate or a semiconductor film.

A semiconductor device indicates all types of devices which can function by using semiconductor characteristics. An electro-optical device such as a liquid crystal display device or a light emitting device, and an electronic device including such an electro-optical device as a part are included in the category of the semiconductor device.

An edge of a beam spot is removed by scanning of a laser beam through a slit disposed between an f-θ lens and an irradiation surface. At this time, either by using a telecentric f-θ lens as an f-θ lens or by changing the slit shape in accordance with the field angle of the laser beam, it becomes easy to project an image at a slit opening portion onto the irradiation surface. By the above-described structure, even when an optical system including a deflector and an f-θ lens is used, the proportion of a microcrystalline region included in a region irradiated with laser beams is reduced, and laser processing can be favorably conducted to a semiconductor film.

Although scanning of a laser beam is carried out by a deflector, an influence by optical axis displacement in the deflector can be reduced by using a slit and a projection lens. In addition, by adjusting a projection magnification of an image at a slit opening portion, an influence by a processing error of a slit can be reduced. Therefore, positional stability can be kept in an irradiation region over a processing object. Further, since it is not necessary to use a high-speed transfer stage in an apparatus, there is an advantage of being able to reduce the size of a footprint of the apparatus. In addition, an operation stop time in converting the scanning direction of a laser beam can be shortened extremely. Accordingly, throughput can be improved, and a semiconductor film formed over a large substrate can be efficiently irradiated with a laser beam.

BEST MODE FOR CARRYING OUT THE INVENTION

An embodiment mode and embodiments of the present invention will be described with reference to the drawings. Note that it is easily understood by those skilled in the art that the present invention is not limited to the following description, and various changes may be made in forms and details without departing from the spirit and the scope of the present invention. Therefore, the present invention should not be limited to the descriptions of the embodiment mode and the embodiments below.

Figure 1:
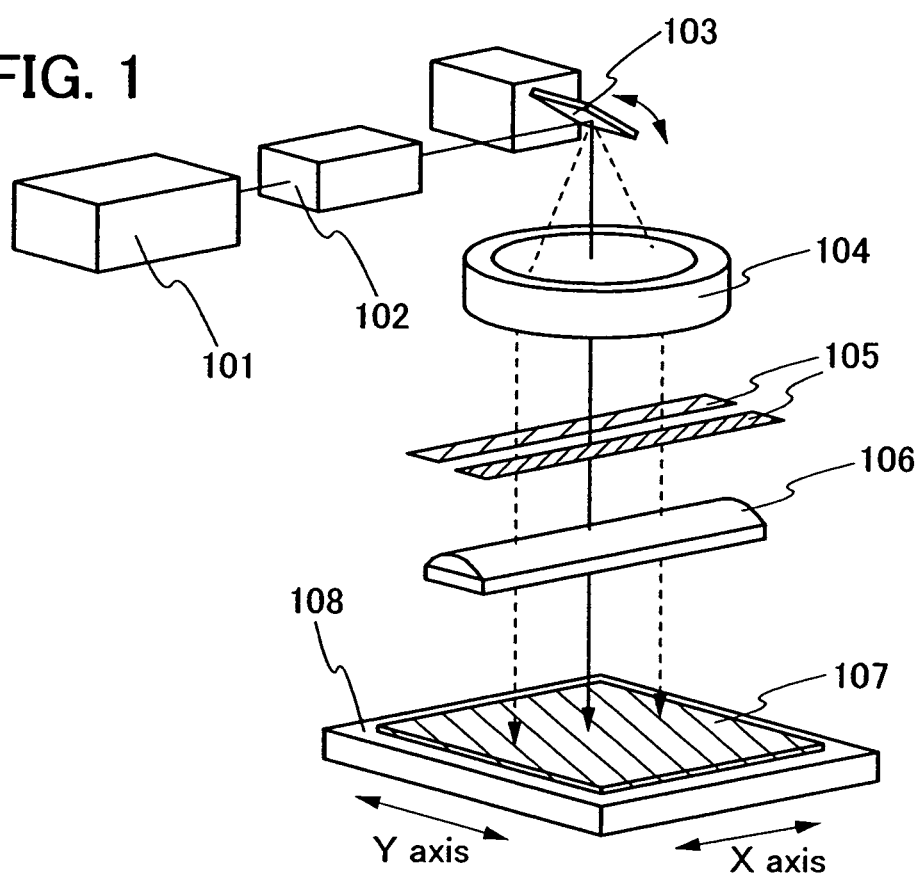
FIG. 1 shows a laser irradiation apparatus of the present invention.

A laser irradiation apparatus of this embodiment mode conducts laser irradiation by deflecting a laser beam which has been emitted from a laser oscillator with a deflector such as a galvanometer mirror. In order to shape the laser beam, an f-θ lens, a slit and a cylindrical lens are disposed in an optical system. FIG. 1 shows an example of a laser irradiation apparatus of the present invention.

A laser oscillator 101 shown in FIG. 1 is not particularly limited, and either of a continuous-wave laser oscillator or a pulsed laser oscillator can be used. As examples of the continuous-wave laser oscillator, there are an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a helium-cadmium laser, a GaN laser, a GaAs laser, an InAs laser, and the like. In addition, as examples of the pulsed laser oscillator, there are an Ar laser, a Kr laser, an excimer laser, a $CO_2$ laser, a YAG laser, a $YVO_4$ laser, a YLF laser, a $YAlO_3$ laser, a $GdVO_4$ laser, a $Y_2O_3$ laser, a glass laser, a ruby laser, an alexandrite laser, a Ti:sapphire laser, a GaN laser, a GaAs laser, an InAs laser, a copper vapor laser, a gold vapor laser, and the like.

A laser beam emitted from the laser oscillator 101 passes through a cylindrical expander 102 which expands the width of the laser beam in one direction. The cylindrical expander 102 is used for forming the major-axis direction of a linear beam spot on an irradiation surface. Note that in the case of emitting a laser beam having a linear shape or a rectangular shape from a laser oscillator, the cylindrical expander 102 is not necessarily provided. The laser beam having passed through the cylindrical expander 102 enters a galvanometer mirror 103. A galvanometer mirror has a function of deflecting a laser beam and can scan an irradiation surface with a laser beam by changing the angle of inclination of the galvanometer mirror. An example of using the galvanometer mirror as deflecting means has been described here; however, the present invention is not limited to this, and a deflector such as a polygon mirror, an AOD (Acousto-Optic Deflector), an EOD (Electro Optical Deflector), a resonant scanner, a hologram scanner or a conical scanner may also be used instead of the galvanometer mirror.

The laser beam deflected by the galvanometer mirror 103 enters a telecentric f-θ lens 104. A telecentric f-θ lens is an f-θ lens having an image space telecentric characteristic. When the telecentric f-θ lens is used, the incidence angle of a laser beam from the telecentric f-θ lens to an irradiation surface can be fixed. In this embodiment mode, an example of facilitating disposition of a slit in an optical system by utilizing such knowledge will be described.

Figure 3:
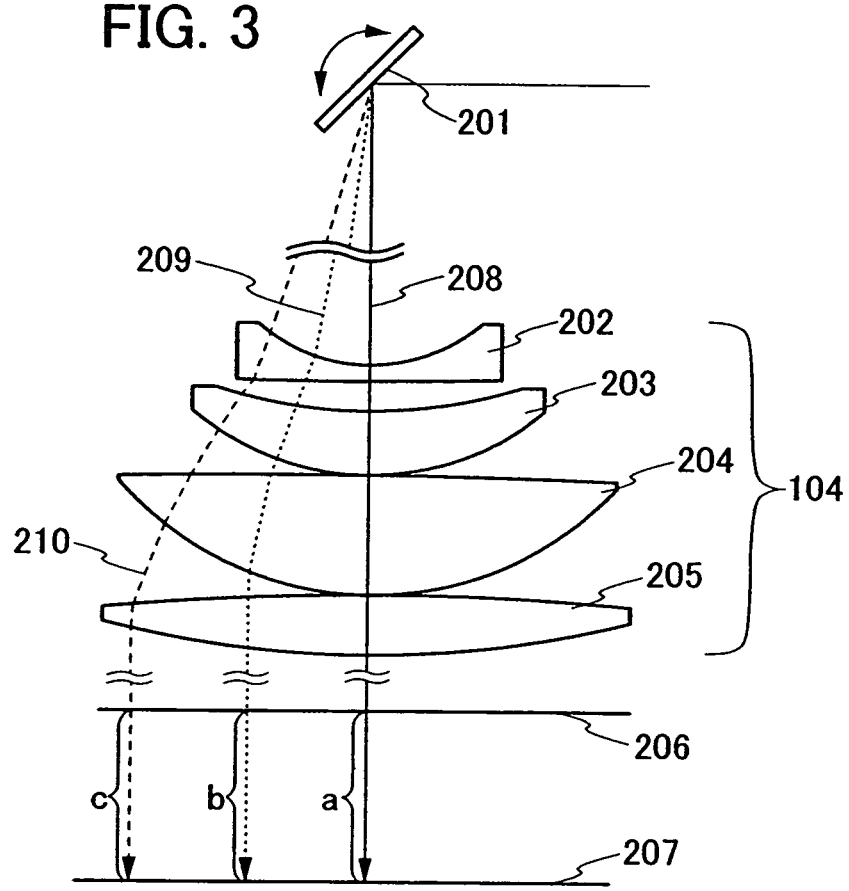
FIG. 3 shows an optical system and a distortion characteristic of an f-θ lens of a laser irradiation apparatus of the present invention.

The telecentric f-θ lens used here is appropriately designed in consideration of the wavelength of a laser beam, a desired scan range on an irradiation surface and an aberration property. As an example of the telecentric f-θ lens 104, a cross section of an f-θ lens designed for a laser beam with a wavelength of 532 nm is shown in FIG. 3. The telecentric f-θ lens 104 is formed of four spherical lenses (a lens 202, a lens 203, a lens 204 and a lens 205). As a material of the lenses, BK7 is used. The lens 202 has a first surface with a curvature radius of −57.5 mm, a second surface with a curvature radius of 1638.2 mm, and a lens thickness of 5.6 mm. The lens 203 has a first surface with a curvature radius of −168.3 mm, a second surface with a curvature radius of −91.7 mm, and a lens thickness of 22.2 mm. The lens 204 has a first surface with a curvature radius of 3100 mm, a second surface with a curvature radius of −113.3 mm, and a lens thickness of 41.3 mm. The lens 205 has a first surface with a curvature radius of 979.5 mm, a second surface with a curvature radius of −358 mm, and a lens thickness of 20.7 mm. The lens 202 is disposed in a position which is 116.1 mm away from a galvanometer mirror 201. The distance between the lens 202 and the lens 203 is set at 10.3 mm, the distance between the lens 203 and the lens 204 is set at 0.1 mm, and the distance between the lens 204 and the lens 205 is set at 0.1 mm. Further, the distance between the lens 205 and an irradiation surface 207 is set at 326.8 mm. Note in this specification that in the description of disposition of lenses, the traveling direction of a laser beam is referred to as the front. In addition, in a lens, an incidence side of a laser beam is denoted by a first surface, and an emission side is denoted by a second surface. The sign of the curvature radius is negative when a curvature center is on an incidence side of a laser beam from a lens, and positive when the curvature center is on an emission side.

Figure 4:
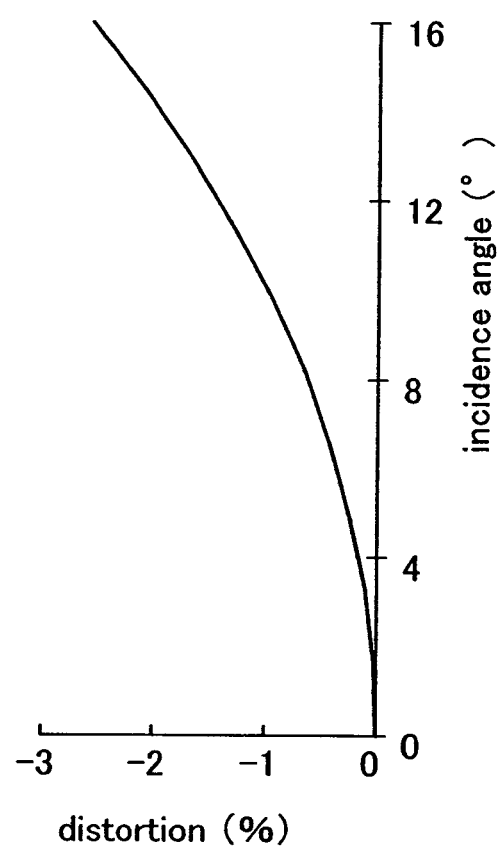
FIG. 4 shows a distortion characteristic of an f-θ lens.

Here, the telecentric f-θ lens 104 is designed so as to have distortion shown in FIG. 4. Given that y is an image height, f is a focal length, and θ is an incidence angle of a laser beam to the telecentric f-θ lens 104, by the above-described distortion, the telecentric f-θ lens 104 has an f-θ characteristic expressed by the formula, $y=f\theta$. By the above-described fθ characteristic, a plane of a processing object can be scanned with a laser beam at a constant speed. In addition, the telecentric f-θ lens 104 has an image space telecentric characteristic. FIG. 3 shows light paths of laser beams which pass through different regions of the telecentric f-θ lens 104. A light path 208 shown by a solid line corresponds to the case where the angle of inclination of a galvanometer mirror is 0°, a light path 209 shown by a dotted line corresponds to the case where the angle of inclination of the galvanometer mirror is 40, and a light path 210 shown by a dashed line corresponds to the case where the angle of inclination of the galvanometer mirror is 8°. After these principal rays pass through the telecentric f-θ lens 104, they always enter the irradiation surface from a perpendicular direction. Here, in the case where a slit 206 is disposed between the lens 205 and the irradiation surface 207, the distances between the slit 206 and the irradiation surface 207 are expressed by a, b and c when the angle of inclination are 0°, 4°, and 8° respectively. By the above-described telecentric characteristic, the relation, $a=b=c$, is obtained. A laser irradiation apparatus of the present invention pays attention to this respect and conducts laser irradiation by projecting an image at a slit opening portion onto an irradiation surface. By the above-described structure, a slit and an irradiation surface can be easily set to be a conjugate positional relation to each other independently of the field angle of a laser beam. Consequently, an entire scanned range of the laser beam can be favorably crystallized.

Figure 5:
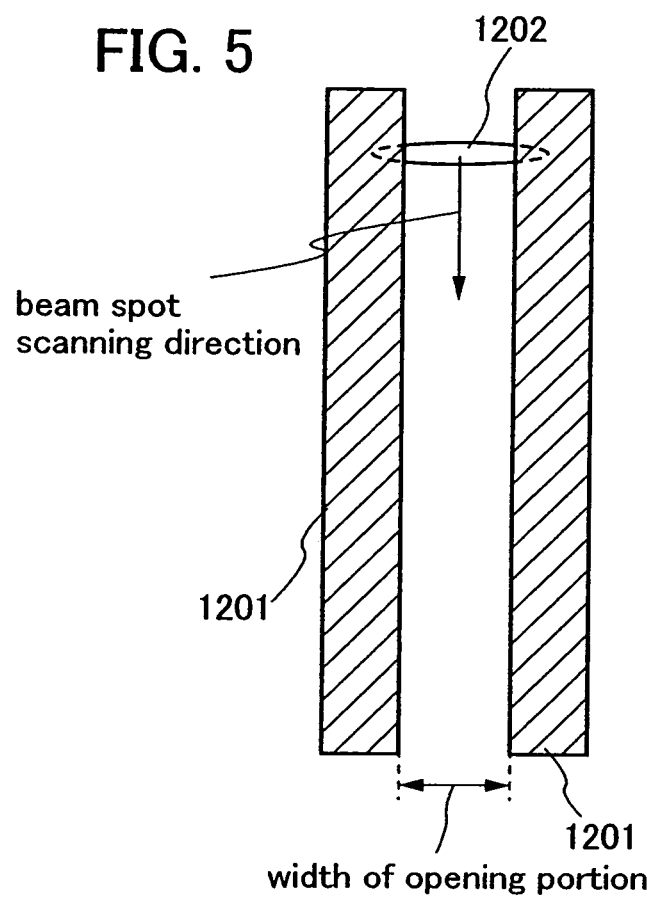
FIG. 5 shows an optical system of a laser irradiation apparatus of the present invention.

The slit used in the present invention is not particularly limited, and a slit having a structure or a shape which can intercept a portion, where intensity is low, of a laser beam when the laser beam passes through the slit, can be used. For example, a laser beam is shielded by using plate-like slits 105 as shown in FIG. 1. The slits 105 can adjust its position in accordance with the kinds of laser beams or the energy. Accordingly, the size of a slit opening portion between the slits can be adjusted. In a laser irradiation apparatus of the present invention, the above-described slits 105 are disposed so as to act on the main-axis direction of a beam spot. In addition, FIG. 5 shows a relation between the slit shape and a cross section of a beam spot. Slits 1201 are disposed so as to be parallel to the scanning direction of a beam spot 1202, and the width of a slit opening portion is set constant in a scan range. Accordingly, both edges of the beam spot, which are regions having low energy, can be removed. Furthermore, the length of the beam spot in a main-axis direction can be adjusted.

Figure 2:
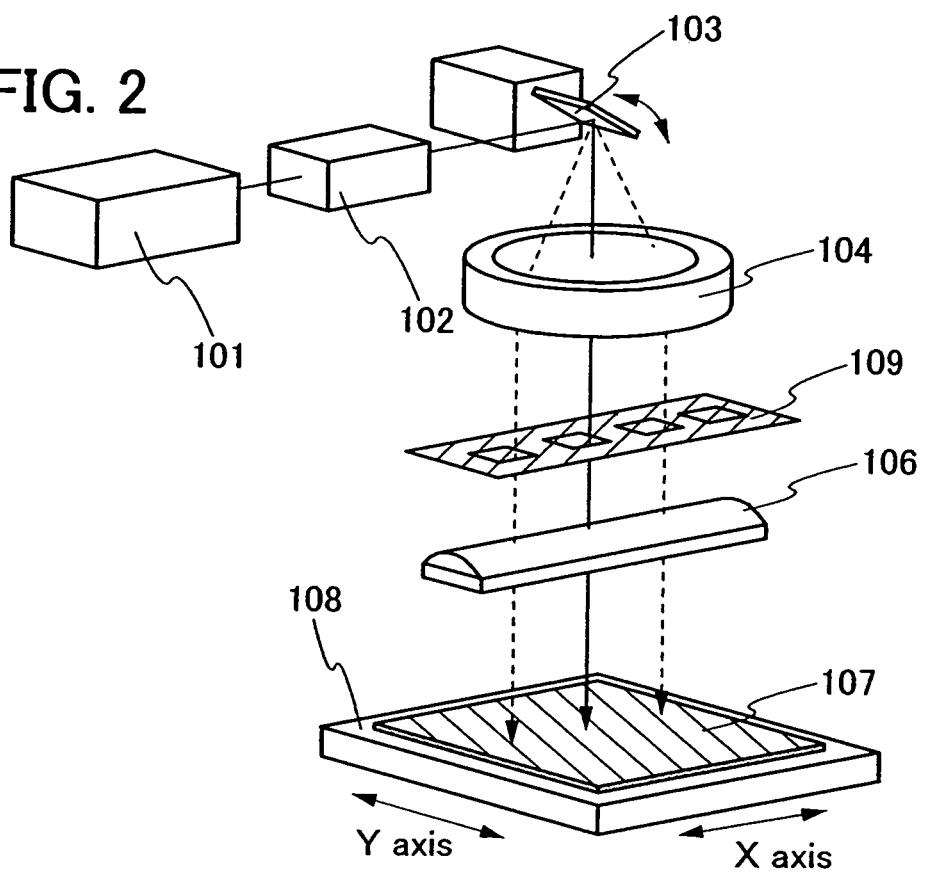
FIG. 2 shows a laser irradiation apparatus of the present invention.
Figure 6:
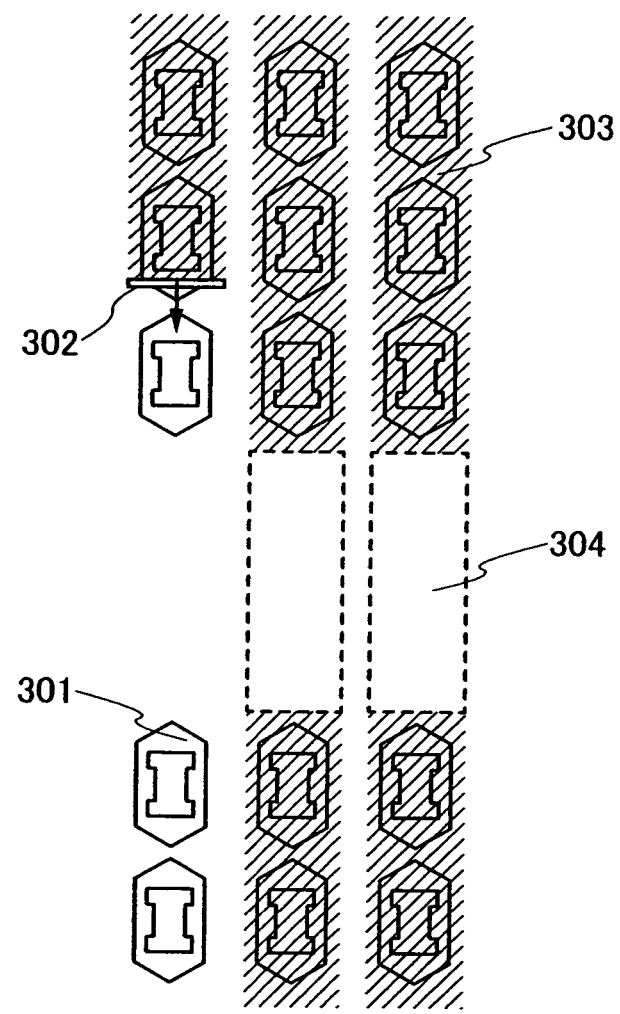
FIG. 6 shows a positional relation between an irradiated portion of a laser beam and a mask shape.

The shape of the slit may be such that opening portions are provided in only portions corresponding to regions to be scanned with laser beams as a slit 109 of FIG. 2. This enables laser irradiation to predetermined positions on a substrate 107. FIG. 6 shows an example of conducting laser irradiation by using the above-described slit 109. FIG. 6 shows an example of a relation between the mask shape in pattering a semiconductor film and a portion irradiated with a laser beam. The arrow in the drawing indicates the scanning direction of the laser beam. After crystallization by laser beam irradiation, the semiconductor film is patterned in accordance with a mask shape 301 for patterning the semiconductor film. A region 303 represents a portion irradiated with a laser beam 302. A region 304 surrounded by a dashed line represents a portion where the laser beam is shielded by the slit. By the above-described method, a portion where crystallization is not necessary is not irradiated with a laser beam; accordingly, damage to a substrate can be reduced.

In the case of conducting laser beam irradiation for a part, the laser beam may be intercepted with an AO modulator or the like instead of using the above-described slit 109. In this case, a portion to scan with a laser beam may be recognized based on mask information and the AO modulator may be synchronized with the operation of the galvanometer mirror so that only a portion that has to be scanned is irradiated with a laser beam.

The laser beam having passed through the slit 109 enters a cylindrical lens 106. The cylindrical lens 106 is disposed so as to form the main-axis direction of a beam spot on an irradiation surface. The cylindrical lens 106 makes the slit opening portion and the substrate 107 to be a conjugate relation to each other. That is, given that the distance between the slit opening portion and the cylindrical lens 106 is "a", the distance between the cylindrical lens 106 and the substrate 107 is "b", and the focal length of the cylindrical lens 106 is "f", the relation of the formula (1) is formed.

$$1/f = 1/a + 1/b \tag{1}$$

At the slit opening portion, an image with the edges of the laser beam eliminated is formed; accordingly, by the above-described relation, the substrate is also irradiated with a laser beam having a favorable energy distribution. The focal length of the cylindrical lens 106 may be determined so that the image at the slit opening portion is reduced when being projected onto the substrate. The image at the slit opening portion is projected onto the substrate at b/a-fold magnification. Accordingly, the slit 109, the cylindrical lens 106 and the substrate 107 may be disposed so that the above-described optical system has such a distance relation as a>b. An advantage of the above-described structure is that a processing error at a slit edge can be reduced when being projected onto the substrate. Thus, an image at the slit opening portion can be manufactured with a relatively large value of the processing error at the slit edge permitted, and scan with a laser beam can be conducted with swell of an irradiation track suppressed to be low.

The cylindrical lens is not particularly limited, and a cylindrical lens having a convex surface either on an incidence side or an emission side, or having convex surfaces on both sides may be used. In consideration of low aberration and accuracy, a cylindrical lens having a convex surface on an incidence side is preferably used.

Figure 7A:
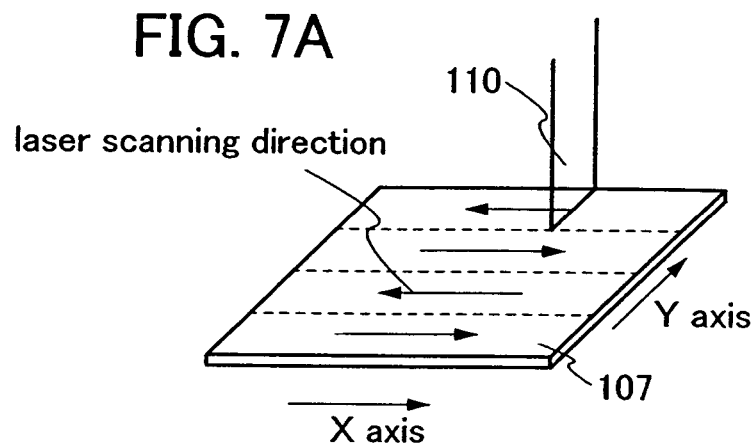
FIGS. 7A and 7B show scanning methods of laser beams.
Figure 7B:
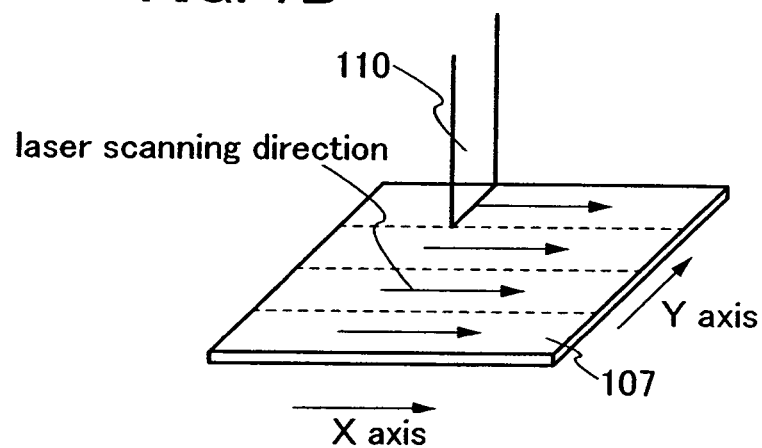

A semiconductor film is formed over the substrate 107 and irradiated with a beam spot formed by the above-described method by scanning. As the substrate 107, a glass substrate typified by alumino borosilicate glass or barium borosilicate glass, a quartz substrate, a ceramic substrate, a stainless-steel substrate, a flexible substrate typified by a plastic substrate or an acrylic substrate, a single-crystalline semiconductor substrate (typically, an N-type or P-type single-crystalline silicon substrate, a GaAs substrate, an InP substrate, a GaN substrate, a SiC substrate or a ZnSe substrate), or the like is used. It is preferable that the substrate 107 is fixed over a suction stage 108 in laser irradiation since the positioning accuracy becomes high. The suction stage 108 is provided over a transfer stage. After the scan of a beam spot in an X-axis direction by using the galvanometer mirror, the transfer stage is moved in a main-axis direction (Y-axis direction) of the beam spot by the length of the beam spot in the main-axis direction. By repeating the above-described operations, laser irradiation can be conducted to an entire surface of the substrate. Note that as the scanning method of a laser beam, either of a scanning method in which a linear beam spot 110 is moved back and forth along the X axis as shown in FIG. 7A or a scanning method in which the linear beam spot is moved in one direction as shown in FIG. 7B may be employed.

By the above-described method, the substrate 107 can be scanned with the laser beam. Note that the slits 105 or the slit 109, the cylindrical lens 106 for projection and the substrate 107 are completely fixed in the above-described optical system, in scanning with the laser beam. Therefore, even when optical axis displacement is generated in a deflector such as a galvanometer mirror, an irradiation track of the laser beam can be fixed in a certain position by a transfer function of the cylindrical lens 106. In addition, since it is not necessary to move the transfer stage at high speed when scanning the laser beam on a substrate, an influence due to straightness of a stage, pitching, or the like is not caused. Therefore, laser irradiation can be conducted stably, and a semiconductor film can be favorably irradiated with a laser beam with a laser irradiation apparatus of the present invention.

Embodiment 1

Embodiment 1 will describe an example of conducting laser irradiation to a semiconductor film by synthesizing laser beams which have been emitted from a plurality of laser oscillators, in order to increase efficiency of laser irradiation.

Figure 8:
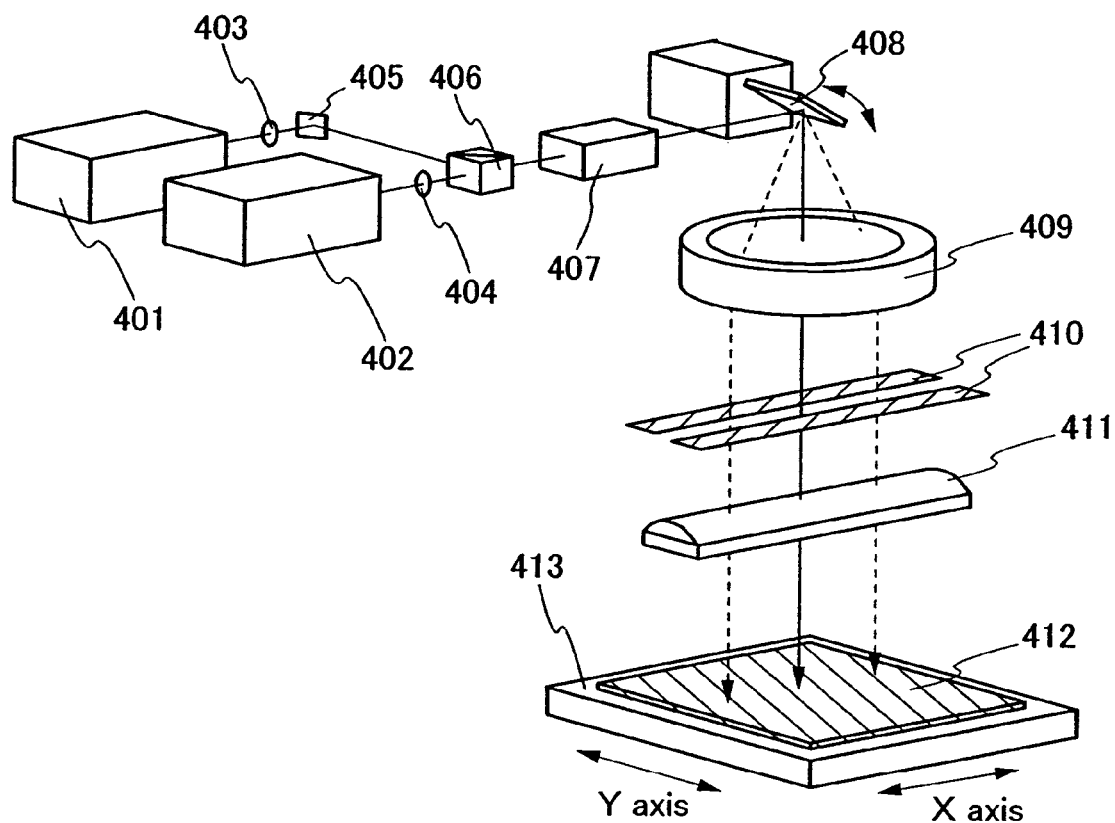
FIG. 8 shows a laser irradiation apparatus of the present invention.

Each of laser oscillators 401 and 402 of FIG. 8 is a mode-locked pulsed laser oscillator having an output power of 20 W, a repetition rate of 80 MHz, a pulse width of 20 to 30 psec, a wavelength of 532 nm, a beam diameter of 1 mm, and $TEM_{00}$ mode (single transverse mode). The mode-locked pulsed laser oscillator has the repetition rate which is extremely higher than a repetition rate of several tens to several hundreds Hz of a conventional pulsed laser oscillator. It is said that it takes several tens to several hundreds nsec to completely solidify a semiconductor film after irradiating the semiconductor film with a pulsed laser beam. With the pulsed laser oscillator having a repetition rate of 10 MHz or more, the semiconductor film can be irradiated with a laser beam after the semiconductor film is melted by the previous laser beam and before the semiconductor film is solidified; accordingly, the melt state can be kept.

Unlike the case of using a conventional pulsed laser oscillator, an interface between a solid phase and a liquid phase can be moved continuously in the semiconductor film, thereby forming a semiconductor film having crystal grains grown continuously in the scanning direction. Specifically, an aggregation of crystal grains each having a width of 10 to 30 µm, preferably 10 to 60 µm, in the scanning direction of the crystal grains and a width of approximately 1 to 5 µm in a direction perpendicular to the scanning direction can be formed.

A laser beam emitted from the laser oscillator 401 passes through a half wave plate 403. After the laser beam passes through the half wave plate 403, the laser beam is s-polarized. Further, the laser beam is reflected by a mirror 405 and enters a polarization beam splitter 406. The laser beam emitted from the laser oscillator 402 passes through a half wave plate 404. After the laser beam passes through the half wave plate 404, the laser beam is p-polarized. At the polarization beam splitter 406, the above-described two laser beams are synthesized. The synthesized laser beam passes through a cylindrical expander 407. The main-axis direction, on an irradiation surface, of a linear beam spot is formed by the cylindrical expander 407. In the case where a laser beam having a linear shape or a rectangular shape is emitted from the laser oscillator, the cylindrical expander 407 is not necessarily provided. The laser beam having passed through the cylindrical expander 407 enters a galvanometer mirror 408. The galvanometer mirror 408 has a function of deflecting a laser beam, and by changing the angle of inclination of the galvanometer mirror 408, the irradiation surface can be scanned with the linear beam spot.

The laser beam deflected by the galvanometer mirror 408 enters a telecentric f-θ lens 409. The telecentric f-θ lens 409 enables the scan speed to be constant when scanning the irradiation surface with the formed beam spot. In addition, the telecentric f-θ lens 409 used here is designed to have an image space telecentric characteristic. Thus, the laser beam having passed through the telecentric f-θ lens 409 has a constant incidence angle to the irradiation surface, independently of the angle of inclination of the galvanometer mirror 408. By the above-described structure, it becomes easier to dispose slits between the telecentric f-θ lens 409 and the irradiation surface and project an image at a slit opening portion onto the irradiation surface. The above-described telecentric f-θ lens 409 is designed by combining a plurality of spherical lenses or cylindrical lenses, in consideration of the wavelength of a laser beam, the scan range, and a desired aberration characteristic. In the case where the telecentric f-θ lens 409 is formed of many lenses, in order to prevent loss of the laser beam in the optical system as much as possible, a structure for preventing the loss of the laser beam, in which a surface of the lens is coated with an anti-reflective film, is preferably formed.

The laser beam having passed through the telecentric f-θ lens 409 passes slits 410. The slits 410 are disposed so as to act on the main-axis direction of a linear beam spot; accordingly, regions where energy is low, at both edges of the linear beam spot can be removed. Furthermore, the length of the beam spot in a main-axis direction can be adjusted.

Then, the image at the slit opening portion is projected onto the irradiation surface by a cylindrical lens 411 which acts on the main-axis direction of the linear beam spot. By the cylindrical lens 411, the slits 410 and the irradiation surface are disposed so as to be a conjugate position. Note that the cylindrical lens 411 is not particularly limited, and a cylindrical lens having a convex surface either on an incidence side or an emission side, or having convex surfaces on both sides may be used. In consideration of low aberration and accuracy, a cylindrical lens having a convex surface on an incidence side is preferably used.

By the above-described method, a beam spot having a length of 500 µm in a main-axis direction and a length of 20 µm in a minor-axis direction is formed. A substrate 412 over which a semiconductor film is formed, is scanned with the formed beam spot. As the substrate 412, a glass substrate typified by alumino borosilicate glass or barium borosilicate glass, a quartz substrate, a ceramic substrate, a stainless-steel substrate, a flexible substrate typified by a plastic substrate or an acrylic substrate, a single-crystalline semiconductor substrate (typically, an N-type or P-type single-crystalline silicon substrate, a GaAs substrate, an InP substrate, a GaN substrate, a SiC substrate or a ZnSe substrate), or the like is used. It is preferable that the substrate 412 is fixed over a suction stage 413 in laser irradiation since the positioning accuracy becomes high. The suction stage 413 is provided over a Y stage. After the scan of a beam spot in an X-axis direction by using the galvanometer mirror, the Y stage is moved in a main-axis direction of the beam spot by the length of the beam spot in a main-axis direction. By repeating the above-described operations, laser irradiation can be conducted to an entire surface of the semiconductor film.

In a laser crystallization apparatus of this embodiment, regions where energy is low, of both edges of a linear beam spot can be removed; accordingly, the proportion of a microcrystalline region included in a laser irradiation region can be decreased and laser irradiation can be favorably conducted to a semiconductor film.

Embodiment 2

Embodiment 2 will describe an example of conducting laser irradiation by deflecting laser beams which have been emitted from a plurality of laser oscillators by deflectors and synthesizing a plurality of beam spots on an irradiation surface.

Figure 9:
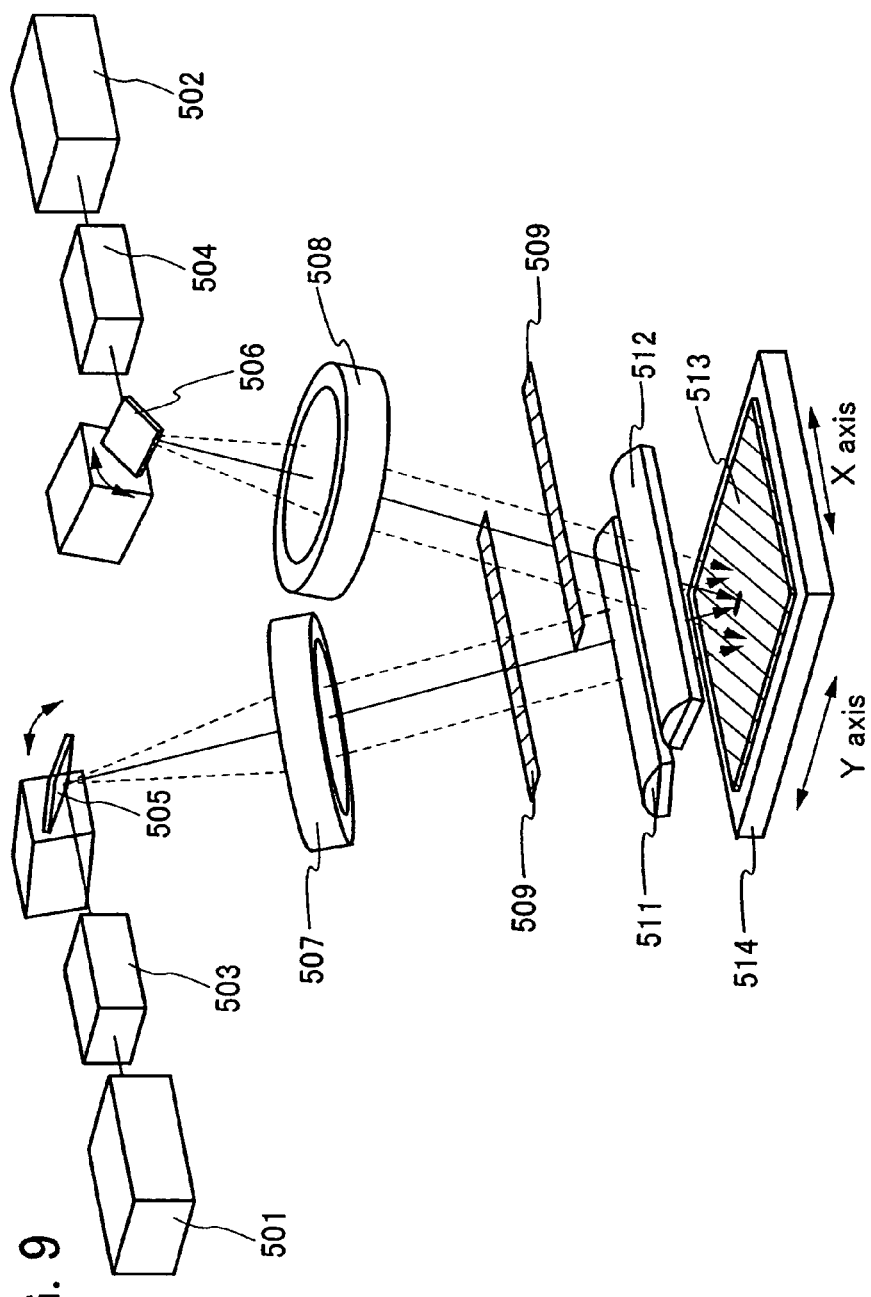
FIG. 9 shows a laser irradiation apparatus of the present invention.

Each of laser oscillators 501 and 502 of FIG. 9 is a mode-locked pulsed laser oscillator having an output power of 10 W, a repetition rate of 80 MHz, a pulse width of 20 to 30 psec, a wavelength of 532 nm, a beam diameter of 1 mm, and $TEM_{00}$ mode (single transverse mode). The mode-locked pulsed laser oscillator has the repetition rate which is extremely higher than a repetition rate of several tens to several hundreds Hz of a conventional pulsed laser oscillator. It is said that it takes several tens to several hundreds nsec to completely solidify a semiconductor film after irradiating the semiconductor film with a pulsed laser beam. With the pulsed laser oscillator having a repetition rate of 10 MHz or more, the semiconductor film can be irradiated with a laser beam after the semiconductor film is melted by the previous laser beam and before the semiconductor film is solidified; accordingly, the melt state can be kept.

Unlike the case of using a conventional pulsed laser oscillator, an interface between a solid phase and a liquid phase can be moved continuously in the semiconductor film, thereby forming a semiconductor film having crystal grains grown continuously in the scanning direction. Specifically, an aggregation of crystal grains each having a width of 10 to 30 µm, preferably 10 to 60 µm, in the scanning direction of the crystal grains and a width of approximately 1 to 5 µm in a direction perpendicular to the scanning direction can be formed.

A laser beam emitted from the laser oscillator 501 passes a cylindrical expander 503 to form the main-axis direction of a linear beam spot on an irradiation surface. In the case where a laser beam having a linear shape or a rectangular shape is emitted from the laser oscillator, the cylindrical expander 503 is not necessarily provided. The laser beam having passed through the cylindrical expander 503 enters a galvanometer mirror 505. The galvanometer mirror 505 has a function of deflecting a laser beam, and by changing the angle of inclination of the galvanometer mirror 505, the irradiation surface can be scanned with the laser beam.

The laser beam deflected by the galvanometer mirror 505 enters a telecentric f-θ lens 507. The telecentric f-θ lens 507 enables the scan speed to be constant when scanning the irradiation surface with the formed beam spot. In addition, the telecentric f-θ lens 507 used here is designed to have an image space telecentric characteristic. Thus, the laser beam having passed through the telecentric f-θ lens 507 has a constant incidence angle to the irradiation surface, independently of the angle of inclination of the galvanometer mirror 505. By the above-described structure, it becomes easier to dispose slits between the telecentric f-θ lens 507 and the irradiation surface and project an image at a slit opening portion onto the irradiation surface. The above-described telecentric f-θ lens 507 is designed by combining a plurality of spherical lenses or cylindrical lenses, in consideration of the wavelength of a laser beam, the scan range, and a desired aberration characteristic. In the case where the telecentric f-θ lens 507 is formed of many lenses, in order to prevent loss of the laser beam in the optical system as much as possible, a structure for preventing the loss of the laser beam, in which a surface of the lens is coated with an anti-reflective film, is preferably formed.

The laser beam having passed through the telecentric f-θ lens 507 passes a slit 509. The slit 509 is disposed so as to act on the main-axis direction of a linear beam spot; accordingly, a region where energy is low, at one edge of the beam spot can be removed. Furthermore, the length of the linear beam spot in a main-axis direction can be adjusted.

Then, the image at the slit opening portion is projected onto the irradiation surface by a cylindrical lens 511 which acts on the main-axis direction of the linear beam spot. By the cylindrical lens 511, the slit 509 and the irradiation surface are disposed so as to be a conjugate position. Note that the cylindrical lens 511 is not particularly limited, and a cylindrical lens having a convex surface either on an incidence side or an emission side, or having convex surfaces on both sides may be used. In consideration of low aberration and accuracy, a cylindrical lens having a convex surface on an incidence side is preferably used.

Similarly to the above-described way, the laser beam emitted from the laser oscillator 502 is formed into a desired beam spot by using a cylindrical expander 504, a galvanometer mirror 506, a telecentric f-θ lens 508, a slit 509 and a cylindrical lens 512.

Figure 10A:
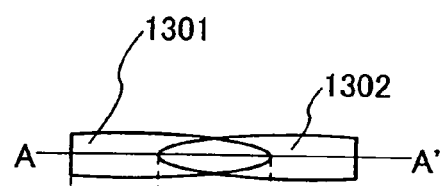
FIGS. 10A and 10B show an overlap method of beam spots.

The slit 509 of this apparatus acts on only one edge of a beam spot in a main-axis direction. The edges on the other side, on which the slit 509 do not act, are overlapped with each other; accordingly, the energy density is set suitable to anneal a semiconductor film. Here, a synthesizing method of laser beams is described in detail with reference to FIGS. 10A and 10B. FIG. 10A shows the shape of two beam spots on an irradiation surface. In the drawing, a first beam spot 1301 indicates a beam spot formed with the laser beam which has been emitted from the laser oscillator 501, and a second beam spot 1302 indicates a beam spot formed with the laser beam which has been emitted from the laser oscillator 502.

Figure 10B:
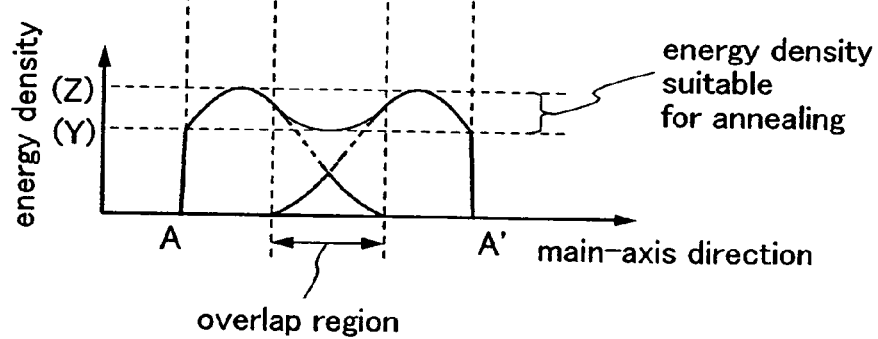

FIG. 10B shows an energy density of a cross section taken along line A-A' of the beam spot. The threshold (Y) indicates an energy density at which a large grain crystal is formed, and the threshold (Z) indicates an energy density at which damage such as film break of a semiconductor film is caused. The energy density from the threshold (Y) to the threshold (Z) is an energy region where only large grain crystals are formed, which is suitable for annealing a semiconductor film.

FIG. 10B shows an energy distribution of a beam spot which is formed by synthesizing the first beam spot 1301 and the second beam spot 1302. Edges in the main-axis direction, on one side of the first beam spot 1301 and the second beam spot 1302 are shielded by slits. Therefore, the energy distribution at both edges of the synthesized beam spot is sharp. On the other hand, each of edges on the side where the first beam spot 1301 and the second beam spot 1302 are overlapped with each other has a Gaussian intensity distribution before synthesis of the beam spots. Then, the first beam spot 1301 and the second beam spot 1302 are overlapped with each other while adjusting the relative position of the beam spots. Accordingly, the energy density having an energy distribution suitable for annealing can be obtained in the overlap region where the beam spots are overlapped with each other.

By synthesizing the beam spots by the above-described method, laser irradiation can be conducted with the longer length of the beam spots in a main-axis direction. Therefore, a wider region can be irradiated with a laser beam in one-time scan, and thus a semiconductor element can have the design freedom. The above-described method has an advantage in small loss of a laser beam in an optical system, since an optical element such as a wave plate or a polarization beam splitter is not necessary. When a plurality of laser beams are synthesized by a polarization beam splitter, a method according to this embodiment is effective in the case where the total energy of the laser beams exceeds the damage threshold of the polarization beam splitter.

Note that in the case of conducting laser irradiation by the method of this embodiment, it is necessary to synthesize two laser beams so that only one beam spot is consistently formed on an irradiation surface. Therefore, beam spots formed by deflection by the galvanometer mirror 505 and the galvanometer mirror 506 may be formed to be consistently overlapped with each other on the irradiation surface by synchronizing operation of the galvanometer mirrors.

By the above-described method, a beam spot having a length of 500 μm in a main-axis direction and a length of 20 μm in a minor-axis direction is formed. A substrate 513 over which a semiconductor film is formed, is scanned with the formed beam spot. As the substrate 513, a glass substrate typified by alumino borosilicate glass or barium borosilicate glass, a quartz substrate, a ceramic substrate, a stainless-steel substrate, a flexible substrate typified by a plastic substrate or an acrylic substrate, a single-crystalline semiconductor substrate (typically, an N-type or P-type single-crystalline silicon substrate, a GaAs substrate, an InP substrate, a GaN substrate, a SiC substrate or a ZnSe substrate), or the like is used. It is preferable that the substrate 513 is fixed over a suction stage 514 in laser irradiation since the positioning accuracy becomes high. The suction stage 514 is provided over a Y stage. After the scan of a beam spot in an X-axis direction by using the galvanometer mirror, the Y stage is moved in a main-axis direction of the beam spot by the length of the beam spot in a main-axis direction. By repeating the above-described operations, laser irradiation can be conducted to an entire surface of the semiconductor film.

In a laser crystallization apparatus of this embodiment, regions where energy is low, of both edges of a linear beam spot can be removed; accordingly, the proportion of a microcrystalline region included in a laser irradiation region can be decreased and laser irradiation can be favorably conducted to a semiconductor film.

Figure 11A:
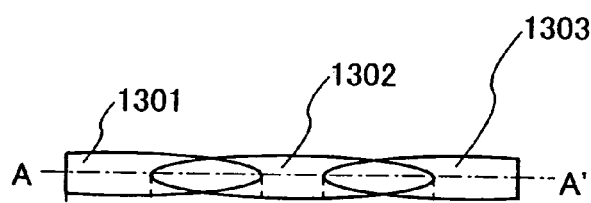
FIGS. 11A and 11B show an overlap method of beam spots.
Figure 11B:
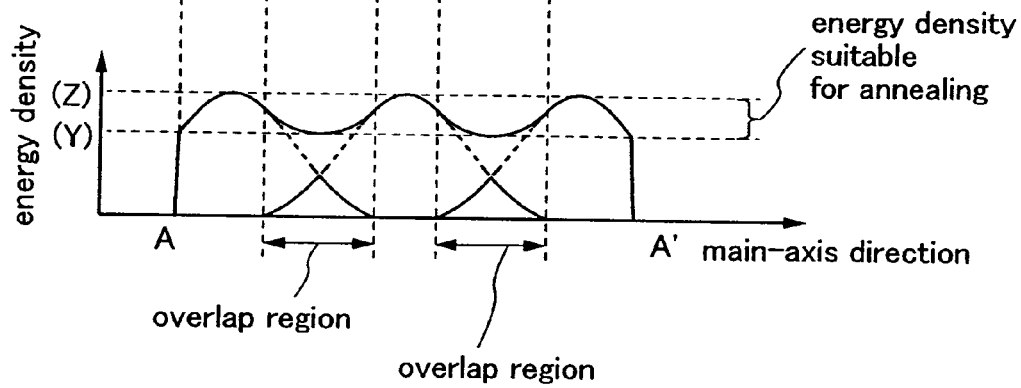

An example of synthesizing two beam spots on the irradiation surface has been described in this embodiment; however, the number of beam spots synthesized is not limited to this. As an example, a method of synthesizing three beam spots is shown in FIGS. 11A and 11B. FIG. 11A shows the shape of three beam spots on an irradiation surface, and FIG. 11B shows an energy density of a cross section A-A' of the beam spots. Similarly to FIG. 10B, the energy density from the threshold (Y) to the threshold (Z) is an energy region where only large grain crystals are formed, which is suitable for annealing a semiconductor film. In order to synthesize three beam spots, one edge of a second beam spot 1302 is overlapped with a first beam spot 1301, and the other edge of the second beam spot 1302 is overlapped with a third beam spot 1303. Accordingly, the Gaussian intensity distributions are overlapped in overlap regions so that the energy density having an energy distribution suitable for annealing is formed after the synthesis. In addition, the other edges of the first beam spot 1301 and the third beam spot 1303 in the main-axis direction are shielded by slits. Thus, regions, where energy is low, of edges of beam spots can be removed. Accordingly, the proportion of a microcrystalline region included in a laser irradiation region can be decreased.

Embodiment 3

Embodiment 3 will describe an example of projecting an image at a slit opening portion onto an irradiation surface by changing the shape of slits disposed between an f-θ lens and the irradiation surface in accordance with the incidence angle of a laser beam.

Figure 12A:
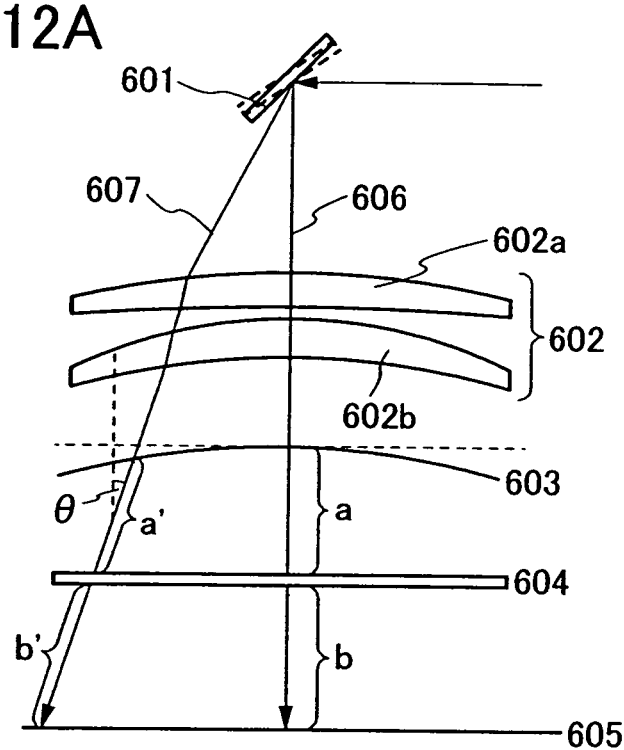
FIGS. 12A and 12B show a laser irradiation apparatus and a slit shape of the present invention.
Figure 12B:
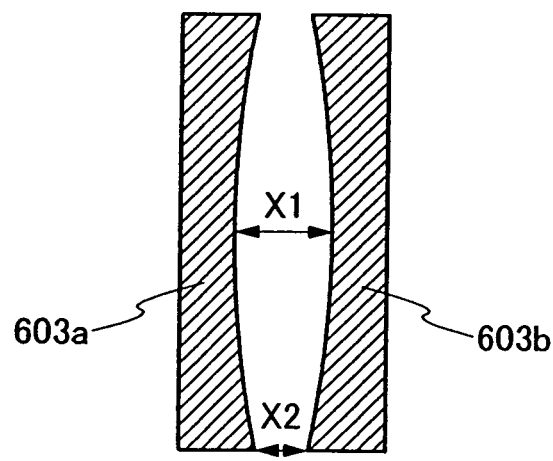

FIGS. 12A and 12B show an example of the above-described optical system. A laser beam emitted from a laser oscillator enters a galvanometer mirror 601. The galvanometer mirror 601 has a function of deflecting a laser beam, and the irradiation surface can be scanned with the laser beam by changing the angle of inclination of the galvanometer mirror 601. The laser beam deflected by the galvanometer mirror 601 is condensed to an irradiation surface 605 by an f-θ lens 602 including two spherical lenses 602a and 602b. Both edges of a beam spot in a main-axis direction, of the laser beam having passed through the f-θ lens 602 are removed by a slit 603.

The slit 603 is disposed so as to be curved as shown in FIG. 12A. The degree of the curve is determined depending on the incidence angle of the laser beam to the irradiation surface. Here, two optical paths 606 and 607 having different incidence angles are given as examples, and the shape of the slit 603 disposed in this optical system is described. The light path 606 is a light path when the laser beam having deflected by the galvanometer mirror 601 enters the irradiation surface 605 from a perpendicular direction. On the other hand, the light path 607 is a light path when the laser beam enters the irradiation surface 605 from an oblique direction. The incidence angle of the light path 607 is denoted by θ in the drawing. In a laser irradiation apparatus of the present invention, the distance of the light path 606 from the slit 603 to an projection lens 604, and the distance of the light path 606 from the projection lens 604 to the irradiation surface 605 are expressed by reference symbols a and b, respectively. The distance of the light path 607 from the slit 603 to the projection lens 604, and the distance of the light path 607 from the projection lens 604 to the irradiation surface 605 are expressed by reference symbols a' and b', respectively. Here, when the focal length of the projection lens 604 is expressed by f, in order to obtain the conjugate positional relation between a slit opening portion and the irradiation surface, the following formulas (1), (2), and (3) may be satisfied:

$$1/f = 1/a + 1/b \quad (1)$$

$$a' = ab/(b + a(1 - \cos\theta)) \quad (2)$$

$$b' = b/\cos\theta \quad (3).$$

By the above-described structure, an image at the slit opening portion can be projected onto the irradiation surface. Accordingly, an influence by a refracting light at the slit can be eliminated. The projection magnifications in projection of the light path 606 and the light path 607 are a/b and a'/b' respectively, and the projection magnification is different between the light paths. Thus, in order to balance out this difference, the width of the slit opening portion may be changed in accordance with the incidence angle θ of a laser beam. FIG. 12B shows the shape of slits 603a and 603b, in which the width of an opening portion is changed in accordance with the incidence angle of a laser beam. Given that the width of the slit opening portion is $X_1$ in a region which the light path 606 passes, and $X_2$ in a region which the light path 607 passes, the relation, $X_1 > X_2$ is obtained. $X_1$ and $X_2$ satisfy the following formula (4):

$$X_2 = bX_1 \cos\theta/(b + a(1 - \cos\theta)) \quad (4)$$

If a slit having the above-described structure is manufactured, an entire irradiation surface can be scanned with beam spots each having the same width in a main-axis direction. In the case of θ=10° and a=b for example, $X_2 = 0.97 X_1$ is obtained from the above-described formula (4). In this case, the slit opening portion has different widths of $X_1$ and $X_2$. Since the energy amount of laser beams passing through the region having $X_1$ is the same as the energy amount of laser beams passing through the region having $X_2$, a difference in energy density of laser beams with which the irradiation surface is irradiated, is generated. However, since the above-described difference is about several %, the energy density can be set so as to obtain large crystal grains in the entire irradiation region in processing a semiconductor film, and there is no practical problem. In addition, when the irradiation energy density is desired to be more constant, the scan speed of the beam spot may be continuously changed by controlling operation speed of a galvanometer mirror, so as to balance out the above-described energy density difference. Laser irradiation at this time may be conducted in accordance with the method described in Japanese Published Patent Application No. 2004-146823, or United States Published Patent Application No. 2004/0065643 or the like. The entire contents of these references are hereby incorporated by reference. In order to balance out the energy density difference, an f-θ lens may be designed so as to have field curvature. Accordingly, the laser beam which passes through the region having $X_1$ forms a wide width in a minor-axis direction of a beam spot on an irradiation surface, and the laser beam which passes through the region having $X_2$ forms a narrow width of the beam spot, so that the irradiation energy density is made constant on the entire irradiation region.

In the above-described method, the example in which the slit having the shape as shown in FIG. 12B is disposed so as to be curved in the optical system, has been described; however, the shape of the slit disposed in a laser irradiation apparatus of the present invention is not limited to this. For example, a method as shown in FIG. 5 may be employed, in which slits 1201 having an opening portion with linear edges are curved in an optical system and disposed to be inclined.

By the above-described method, regions where energy is low, of both edges of a linear beam spot can be removed; accordingly, the proportion of a microcrystalline region included in a laser irradiation region can be decreased and laser irradiation can be favorably conducted to a semiconductor film. An advantage of this embodiment is that because a telecentric f-θ lens is not necessary, an optical system can be formed at low cost. In addition, another advantage of this embodiment is that because the optical system can be formed with small number of lenses, loss of a laser beam in the optical system can be prevented.

Embodiment 4

Embodiment 4 will describe a process in which a thin film chip is manufactured by using a substrate manufactured by the method described in Embodiment Mode, or any of Embodiments 1, 2, and 3 and the thin film chip is mounted on a substrate over which a pixel portion is formed, with reference to FIGS. 13A to 14B.

Figure 13A:
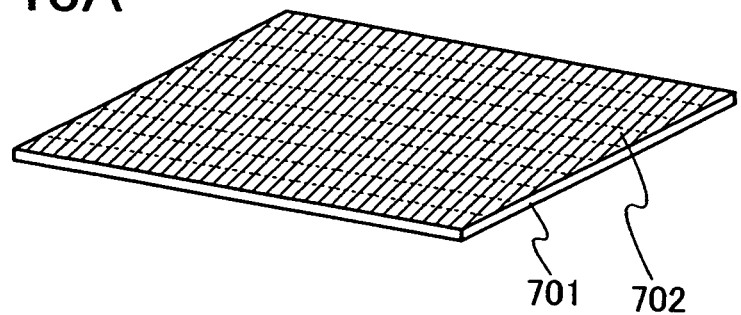
FIGS. 13A and 13B show thin film chips of Embodiment Mode 4.
Figure 13B:
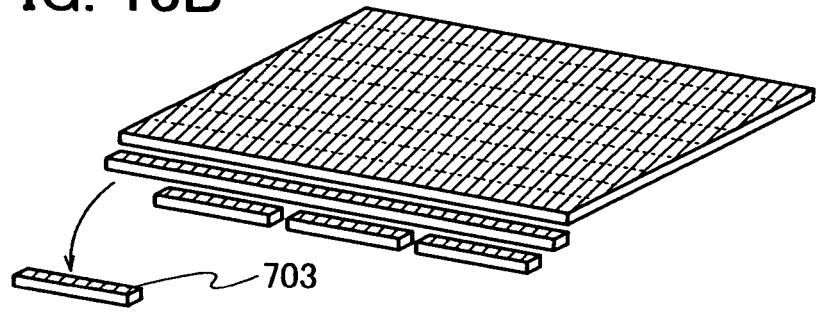

First, a substrate over which a polycrystalline semiconductor thin film is formed by laser irradiation is prepared. FIG. 13A shows a substrate 701 and a semiconductor film 702 formed over the substrate after laser irradiation. After patterning the crystallized semiconductor film 702 over the substrate 701 or after forming a gate electrode, a mask, or the like, doping is conducted. Note that patterning of the semiconductor film may be conducted before crystallization with a laser beam, or the crystallization may be conducted before the patterning. Then, a plurality of integrated circuits are formed over the substrate by activation of a dopant, or formation of various insulating films, wires, or the like. In this process, by using a glass substrate or ceramic substrate, a large substrate having meters of a side can be utilized, and the number of integrated circuits that can be obtained from one substrate becomes larger than that in the case of using a silicon substrate or an SOI substrate. Accordingly, improvement in throughput can be achieved and the process is suitable for mass production. By cutting the substrate 701 as shown in FIG. 13B after forming the integrated circuits, the integrated circuits are separated from each other and a thin film chip 703 is formed.

Figure 14A:
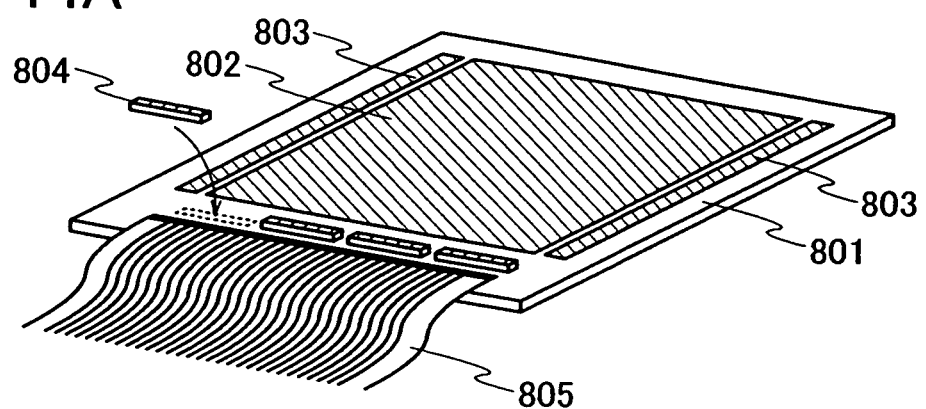
FIGS. 14A and 14B show modes in which a thin film transistor of Embodiment Mode 4 is mounted over a substrate over which a pixel is formed.
Figure 14B:
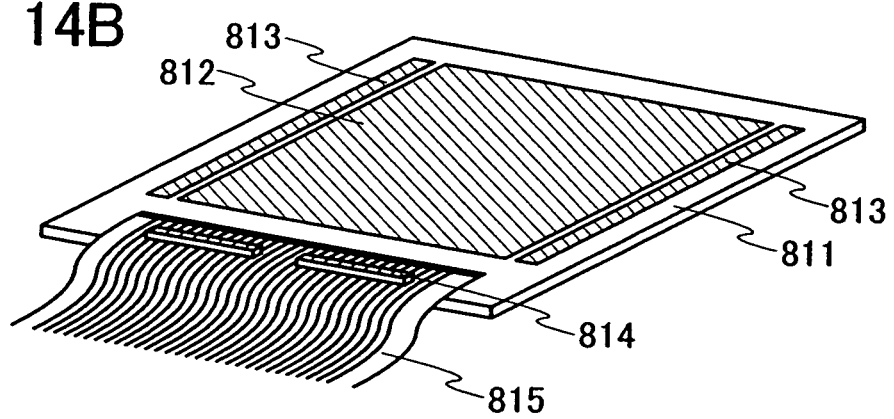

Next, modes of mounting a thin film chip formed by the above-described method onto a substrate formed with a pixel portion is shown in FIGS. 14A and 14B. In FIG. 14A, a pixel portion 802 and a scanning line driver circuit 803 are formed over a substrate 801. In addition, a signal line driver circuit formed in a thin film chip 804 is mounted on the substrate 801. Specifically, the signal line driver circuit formed in the thin film chip 804 is attached to the substrate 801 and electrically connected to the pixel portion 802. The pixel portion 802, the scanning line driver circuit 803, and the signal line driver circuit formed in the thin film chip 804 are each supplied with a potential of a power supply, various signals, or the like through an FPC 805.

In FIG. 14B, a pixel portion 812 and a scanning line driver circuit 813 are formed over a substrate 811. In addition, a signal line driver circuit formed in a thin film chip 814 is further mounted onto an FPC 815 which is mounted onto the substrate 811. The pixel portion 812, the scanning line driver circuit 813, and the signal line driver circuit formed in the thin film chip 814 are each supplied with a potential of a power supply, various signals, or the like through the FPC 815.

A mounting method of a thin film chip is not particularly limited, and a known COG (Chip On Glass) method, a wire bonding method, a TAB (Tape Auto Bonding) method, or the like can be employed. Further, the position for mounting the thin film chip is not limited to those shown in FIGS. 14A and 14B, as long as electrical connection is obtained. Although the example of using the thin film chip only for forming the signal line driver circuit is described in FIGS. 14A and 14B, a scanning line driver circuit may be formed by using a thin film chip. In addition, a controller, a CPU, a memory, or the like may be formed by using a thin film chip and may be mounted. In addition, a thin film chip may be used to form not a whole signal line driver circuit or a scanning line driver circuit but one portion in the driver circuits.

Note that a transistor used in a pixel portion in a semiconductor display device on which a driver circuit is mounted as a thin film chip, is not limited to a TFT including an amorphous semiconductor film using amorphous silicon or the like. A TFT using a microcrystalline semiconductor film or a polycrystalline semiconductor film may be used. A transistor formed by using single crystalline silicon or a transistor using an SOI may be used. Alternatively, a transistor using an organic semiconductor or a transistor using carbon nanotube may be used. By forming an integrated circuit such as a driver circuit by using a thin film chip separately from a substrate and by mounting the thin film chip on the substrate, higher yield can be achieved compared with the case of forming all circuits over a substrate including a pixel portion, and optimization of a process in accordance with a characteristic of each circuit can be easily performed.

Embodiment 5

Embodiment 5 will describe a structure of a CPU (Central Processing Unit) manufactured by using a polycrystalline semiconductor thin film substrate which is manufactured by the method described in Embodiment Mode or any of Embodiments 1, 2, and 3.

Figure 15:
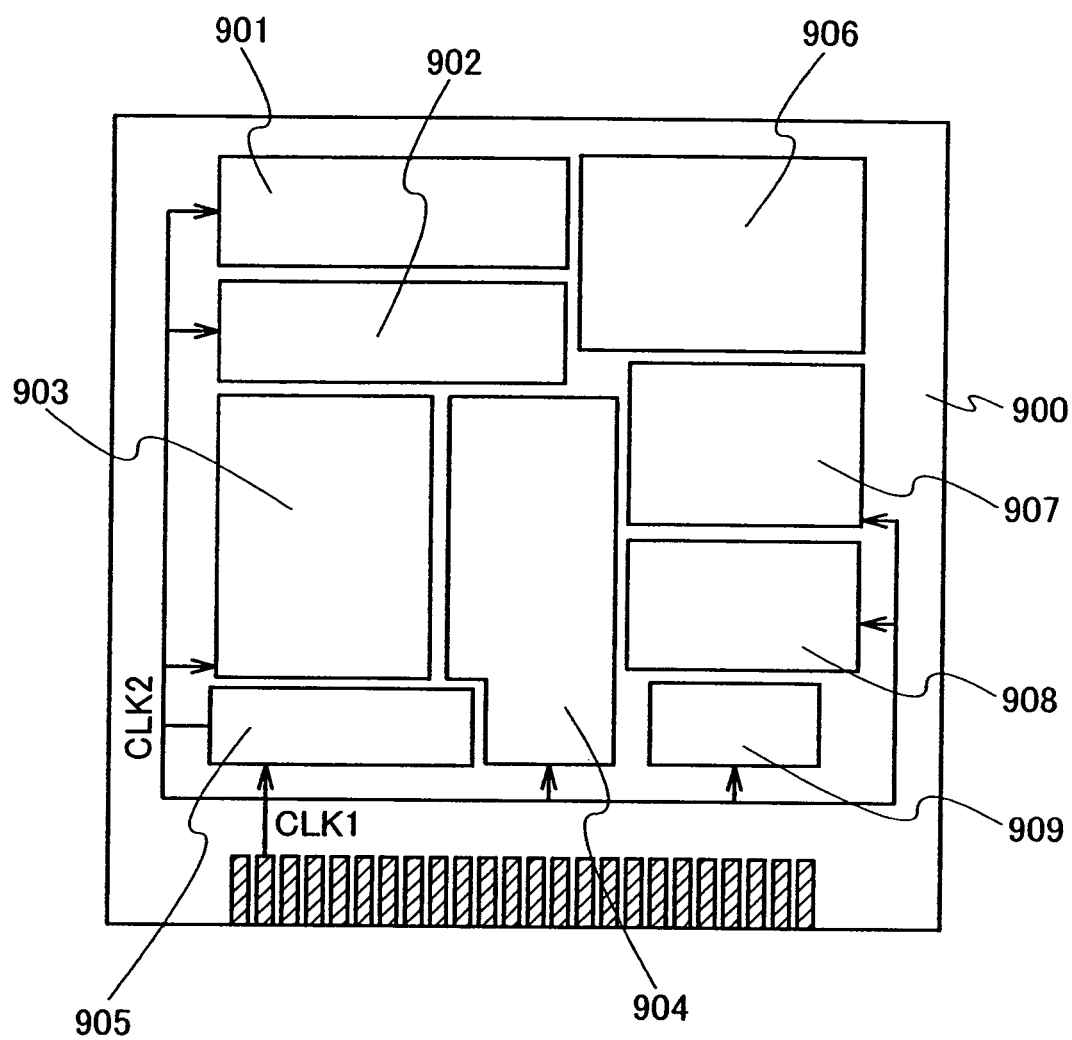
FIG. 15 shows a CPU of Embodiment Mode 5.
Figure 16:
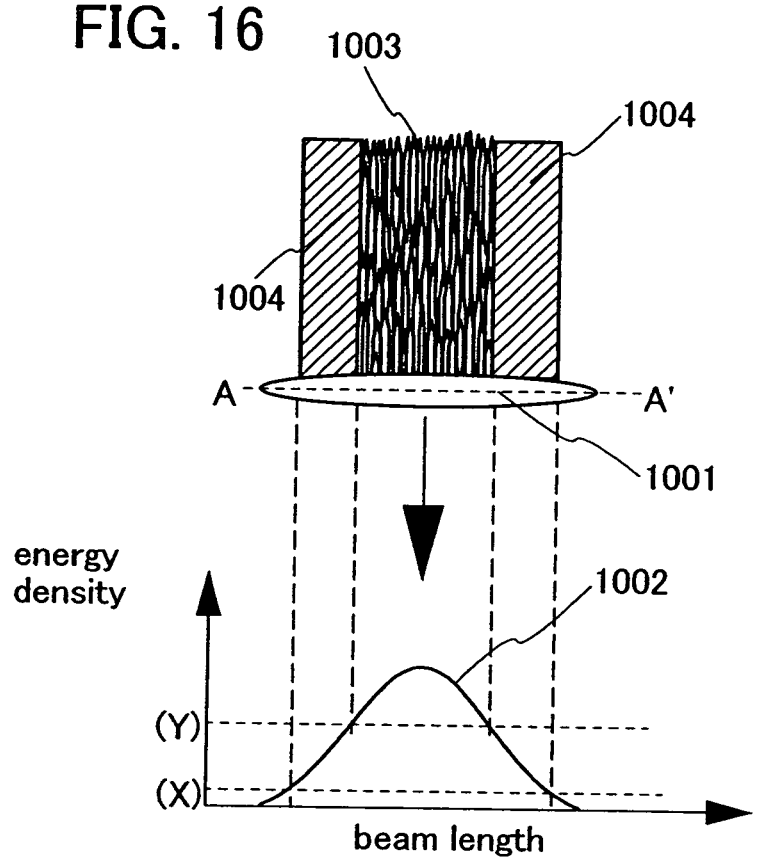
FIG. 16 shows a shape of a laser beam, a laser irradiation track, and an energy density distribution.
Figure 17A:
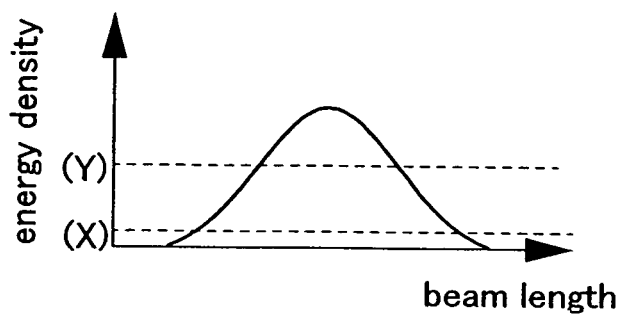
FIGS. 17A and 17B show energy density distributions of laser beams.
Figure 17B:
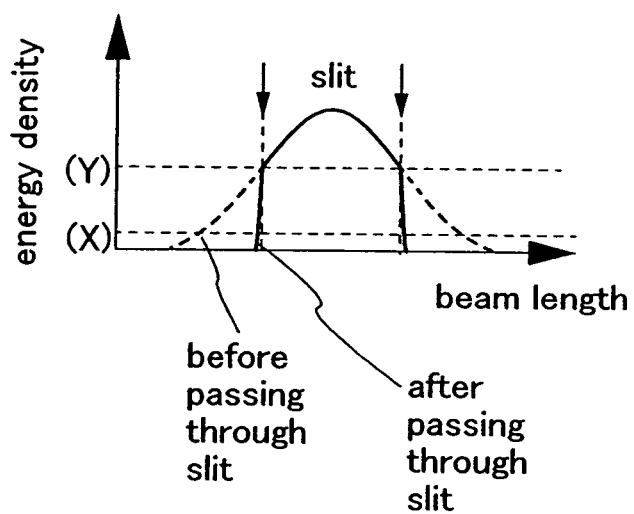
Figure 18A:
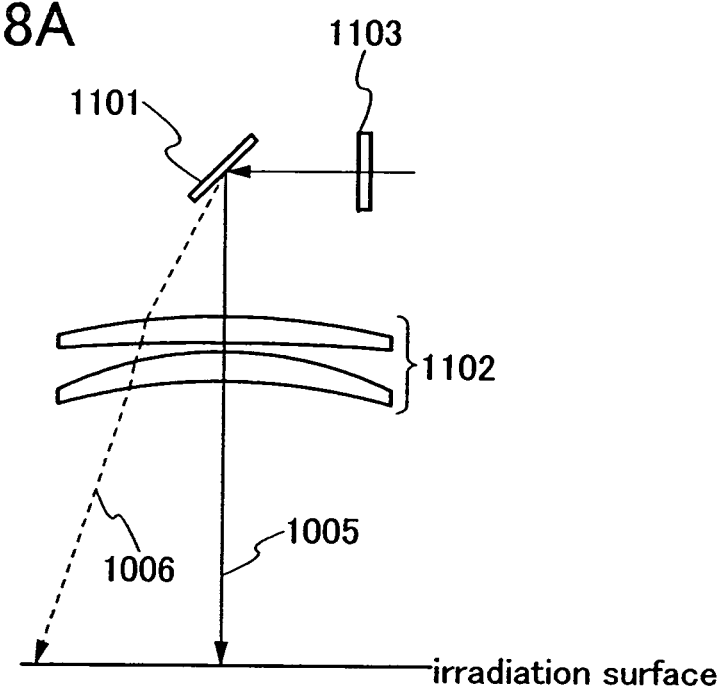
FIGS. 18A and 18B show an example of a laser irradiation apparatus.
Figure 18B:
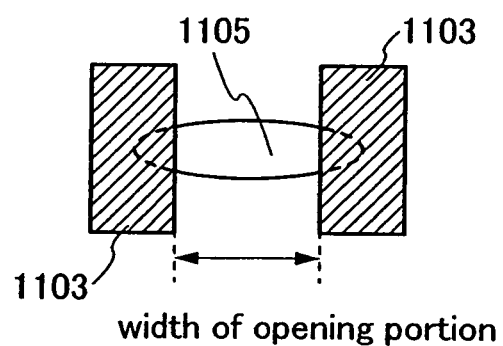

FIG. 15 shows a structure of the CPU of this embodiment. The CPU shown in FIG. 15 mainly includes an arithmetic logic unit (ALU) 901, an ALU controller 902, an instruction decoder 903, an interrupt controller 904, a timing controller 905, a register 906, a register controller 907, a bus interface (Bus I/F) 908, and a read only memory (ROM) 909, over a substrate 900. Obviously, the CPU shown in FIG. 15 is only an example in which the structure is simplified, and an actual CPU may have various structures depending on the uses.

An instruction inputted to the CPU through the bus I/F 908 is inputted to the instruction decoder 903 and decoded therein, and then, inputted to the ALU controller 902, the interrupt controller 904, the register controller 907 and the timing controller 905.

The ALU controller 902, the interrupt controller 904, the register controller 907 and the timing controller 905 conduct various controls based on the decoded instruction. Specifically, the ALU controller 902 generates signals for controlling the drive of the ALU 901. While the CPU is executing a program, the interrupt controller 904 judges an interrupt request from an external input/output device or a peripheral circuit based on its priority or a mask state, and processes the request. The register controller 907 generates an address of the register 906, and reads/writes data from/to the register 906 in accordance with the state of the CPU.

The timing controller 905 generates signals for controlling a drive timing of the ALU 901, the ALU controller 902, the instruction decoder 903, the interrupt controller 904 and the register controller 907. For example, the timing controller 905 is provided with an internal clock generator for generating an internal clock signal CLK2 based on a reference clock signal CLK1, and supplies the clock signal CLK2 to the various above circuits. Various programs executed in the CPU are stored in the ROM 909.

In this embodiment, description has been made of the CPU as an example; however, a semiconductor device of the present invention is not limited to a CPU. Similarly to Embodiment 4, using a glass substrate or a ceramic substrate is advantageous in mass production, because it enables a plurality of CPUs to be manufactured over one large-sized substrate.

This application is based on Japanese Patent Application serial no. 2005-362766 filed in Japan Patent Office on Dec. 16, 2005, the entire contents of which are hereby incorporated by reference.

EXPLANATION OF REFERENCE

101: laser oscillator, 102: cylindrical expander, 103: galvanometer mirror, 104: telecentric f-θ lens, 105: slit, 106: cylindrical lens, 107: substrate, 108: adsorption stage, 109: slit, 110: beam spot, 201: galvanometer mirror, 202: lens, 203: lens, 204: lens, 205: lens, 206: slit, 207: irradiation surface, 208: light path, 209: light path, 210: light path, 301: mask shape, 302: laser beam, 303: region, 304: region, 401: laser oscillator, 402: laser oscillator, 403: half wave plate, 404: half wave plate, 405: mirror, 406: polarization beam splitter, 407: cylindrical expander, 408: galvanometer mirror, 409: telecentric f-θ lens, 410: slit, 411: cylindrical lens, 412: substrate, 413: adsorption stage, 501: laser oscillator, 502: laser oscillator, 503: cylindrical expander, 504: cylindrical expander, 505: galvanometer mirror, 506: galvanometer mirror, 507: telecentric f-θ lens, 508: telecentric f-θ lens, 509: slit, 511: cylindrical lens, 512: cylindrical lens, 513: substrate, 514: adsorption stage, 601: galvanometer mirror, 602: f-θ lens, 602a: spherical lens, 602b: spherical lens, 603: slit, 603a: slit, 603b: slit, 604: projection lens, 605: irradiation surface, 606: light path, 607: light path, 701: substrate, 702: semiconductor film, 703: thin film chip, 801: substrate, 802: pixel portion, 803: scanning line driver circuit, 804: thin film chip, 805: FPC, 811: substrate, 812: pixel portion, 813: scanning line driver circuit, 814: thin film chip, 815: FPC, 900: substrate, 901: arithmetic logic unit, 902: ALU controller, 903: instruction decoder, 904: interrupt controller, 905: timing controller, 906: register, 907: register controller, 908: bus interface, 909: read only memory, 1001: beam spot, 1002: energy density distribution, 1003: region, 1004: region, 1005: light path, 1006: light path, 1101: galvanometer mirror, 1102: f-θ lens, 1103: slit, 1105: cross section, 1201: slit, 1202: beam spot, 1301: first beam spot, 1302: second beam spot, and 1303: third beam spot.

The invention claimed is:

1. A laser irradiation apparatus comprising:
a laser oscillator;
a deflector which deflects a laser beam emitted from the laser oscillator at a deflection surface;
an imaging optical system which condenses the laser beam deflected by the deflector to an irradiation surface;
a slit plate between the imaging optical system and the irradiation surface, wherein the slit plate intercepts an edge of the laser beam; and
a projection lens which projects an image formed at a slit opening portion of the slit plate in a path which the laser beam passes onto the irradiation surface,
wherein the deflector is capable of scanning the irradiation surface with the laser beam by changing an angle of inclination of the deflection surface,
wherein the slit opening portion is elongated in a direction parallel to a scanning direction of the laser beam.

2. The laser irradiation apparatus according to claim 1, wherein the laser oscillator is at least one of a continuous-wave laser oscillator selected from the group consisting of an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a helium-cadmium laser, a GaN laser, a GaAs laser, and an InAs laser.

3. The laser irradiation apparatus according to claim 1, wherein the laser oscillator is at least one of a pulsed laser oscillator selected from the group consisting of an Ar laser, a Kr laser, an excimer laser, a $CO_2$ laser, a YAG laser, a $YVO_4$ laser, a YLF laser, a $YAlO_3$ laser, a $GdVO_4$ laser, a $Y_2O_3$ laser, a glass laser, a ruby laser, an alexandrite laser, a Ti:sapphire laser, a GaN laser, a GaAs laser, an InAs laser, a copper vapor laser, and a gold vapor laser.

4. The laser irradiation apparatus according to claim 1, wherein the laser beam is a higher harmonic wave converted by a nonlinear optical device.

5. The laser irradiation apparatus according to claim 1, wherein the deflector is at least one of the group consisting of a galvanometer mirror, a polygon mirror, an acousto-optic deflector, an electro optical deflector, a resonant scanner, a hologram scanner and a conical scanner.

6. The laser irradiation apparatus according to claim 1, wherein the imaging optical system is an f-θ lens or a telecentric f-θ lens.

7. The laser irradiation apparatus according to claim 1, wherein the projection lens is a convex cylindrical lens.

8. A laser irradiation apparatus comprising:
a laser oscillator;
an optical system which processes a laser beam emitted from the laser oscillator so as to form a linear beam spot on an irradiation surface;
a deflector which deflects the laser beam at a deflection surface;
an imaging optical system which condenses the laser beam deflected by the deflector to the irradiation surface;
a slit plate between the imaging optical system and the irradiation surface, wherein the slit plate intercepts an edge of the laser beam; and
a projection lens which projects an image formed at a slit opening portion of the slit plate in a path which the laser beam passes onto the irradiation surface,
wherein the deflector is capable of scanning the irradiation surface with the laser beam by changing an angle of inclination of the deflection surface, and
wherein the slit opening portion is elongated in a direction parallel to a scanning direction of the laser beam.

9. The laser irradiation apparatus according to claim 8, wherein the laser oscillator is at least one of a continuous-wave laser oscillator selected from the group consisting of an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a helium-cadmium laser, a GaN laser, a GaAs laser, and an InAs laser.

10. The laser irradiation apparatus according to claim 8, wherein the laser oscillator is at least one of a pulsed laser oscillator selected from the group consisting of an Ar laser, a Kr laser, an excimer laser, a $CO_2$ laser, a YAG laser, a $YVO_4$ laser, a YLF laser, a $YAlO_3$ laser, a $GdVO_4$ laser, a $Y_2O_3$ laser, a glass laser, a ruby laser, an alexandrite laser, a Ti:sapphire laser, a GaN laser, a GaAs laser, an InAs laser, a copper vapor laser, and a gold vapor laser.

11. The laser irradiation apparatus according to claim 8, wherein the laser beam is a higher harmonic wave converted by a nonlinear optical device.

12. The laser irradiation apparatus according to claim 8, wherein the deflector is at least one of the group consisting of a galvanometer mirror, a polygon mirror, an acousto-optic deflector, an electro optical deflector, a resonant scanner, a hologram scanner and a conical scanner.

13. The laser irradiation apparatus according to claim 8, wherein the imaging optical system is an f-θ lens or a telecentric f-θ lens.

14. The laser irradiation apparatus according to claim 8, wherein the projection lens is a convex cylindrical lens.

15. The laser irradiation apparatus according to claim 8, wherein the linear beam spot is scanned in a minor-axis direction.

* * * * *

UNITED STATES PATENT AND TRADEMARK OFFICE
CERTIFICATE OF CORRECTION

| | | |
|---|---|---|
| PATENT NO. | : 8,455,790 B2 | Page 1 of 1 |
| APPLICATION NO. | : 11/636596 | |
| DATED | : June 4, 2013 | |
| INVENTOR(S) | : Tanaka et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1759 days.

Signed and Sealed this
Fifteenth Day of December, 2015

Michelle K. Lee
*Director of the United States Patent and Trademark Office*